United States Patent
Ando et al.

(10) Patent No.: US 10,446,603 B2
(45) Date of Patent: Oct. 15, 2019

(54) IMAGING ELEMENT, DRIVING METHOD OF IMAGING ELEMENT, AND ELECTRONIC DEVICE

(71) Applicant: SONY CORPORATION, Tokyo (JP)

(72) Inventors: Yoshihiro Ando, Kanagawa (JP); Fumihiko Koga, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/064,765

(22) PCT Filed: Dec. 28, 2016

(86) PCT No.: PCT/JP2016/089037
§ 371 (c)(1),
(2) Date: Jun. 21, 2018

(87) PCT Pub. No.: WO2017/122542
PCT Pub. Date: Jul. 20, 2017

(65) Prior Publication Data
US 2019/0006412 A1    Jan. 3, 2019

(30) Foreign Application Priority Data
Jan. 13, 2016 (JP) ................................ 2016-004119

(51) Int. Cl.
*H01L 27/148* (2006.01)
*H01L 27/146* (2006.01)
(Continued)

(52) U.S. Cl.
CPC ...... *H01L 27/14812* (2013.01); *H01L 27/146* (2013.01); *H01L 27/14612* (2013.01);
(Continued)

(58) Field of Classification Search
CPC ......... H01L 27/14812; H01L 27/14643; H01L 27/14616; H01L 27/14614;
(Continued)

(56) References Cited

U.S. PATENT DOCUMENTS 9,200,952 B2 * 12/2015 Kozuma ................... G01J 1/44
9,438,833 B2 * 9/2016 Ishiwata ........... H01L 27/14603
(Continued)

FOREIGN PATENT DOCUMENTS

CN   101867734 A   10/2010
CN   103475829 A   12/2013
(Continued)

OTHER PUBLICATIONS

International Search Report and Written Opinion of PCT Application No. PCT/JP2016/089037, dated Mar. 21, 2017, 07 pages of ISRWO.

*Primary Examiner* — William Coleman
(74) *Attorney, Agent, or Firm* — Chip Law Group

(57) ABSTRACT

The present technology relates to an imaging element, a driving method of an imaging element, and an electronic device capable of preventing deterioration in image quality. The imaging element reads a first signal in a state where a charge holding unit is reset, reads a second signal in a state where a reset transistor is turned off, reads a third signal in a state where charges obtained by photoelectric conversion are accumulated in the charge holding unit, reads a fourth signal in a state where the charge holding unit is reset, and sets a reset signal to an intermediate voltage between an on voltage and an off voltage before the reset signal to a gate electrode of the reset transistor is switched from the on voltage to the off voltage after the first signal is read, and generates a noise signal by correlated double sampling of the first signal and the second signal, generates a data signal by correlated double sampling of the third signal and the fourth
(Continued)

signal, and generates an output signal by correlated double sampling of the data signal and the noise signal. The present technology is applied to, for example, an imaging element.

16 Claims, 22 Drawing Sheets

(51) Int. Cl.
| | | |
|---|---|---|
| *H04N 5/363* | (2011.01) | |
| *H04N 5/374* | (2011.01) | |
| *H04N 5/378* | (2011.01) | |
| *H04N 5/357* | (2011.01) | |
| *H04N 5/376* | (2011.01) | |

(52) U.S. Cl.
CPC .. *H01L 27/14614* (2013.01); *H01L 27/14616* (2013.01); *H01L 27/14643* (2013.01); *H04N 5/3575* (2013.01); *H04N 5/363* (2013.01); *H04N 5/374* (2013.01); *H04N 5/376* (2013.01); *H04N 5/378* (2013.01); *H01L 27/14634* (2013.01)

(58) Field of Classification Search
CPC ............. H01L 27/14612; H01L 27/146; H01L 27/14634; H04N 5/376; H04N 5/3575; H04N 5/378; H04N 5/374; H04N 5/363
See application file for complete search history.

(56) References Cited

U.S. PATENT DOCUMENTS

| | | | |
|---|---|---|---|
| 9,635,301 B2* | 4/2017 | Mizuguchi | ........... H04N 5/3745 |
| 10,225,500 B2* | 3/2019 | Yanagida | ............... H04N 5/363 |
| 2010/0253560 A1 | 10/2010 | Kudo | |
| 2012/0175636 A1* | 7/2012 | Ihara | ................... H01L 27/1461 |
| | | | 257/77 |
| 2013/0327924 A1 | 12/2013 | Machida | |
| 2015/0229857 A1 | 8/2015 | Ichikawa et al. | |
| 2018/0213219 A1* | 7/2018 | Kono | ................... H04N 17/002 |

FOREIGN PATENT DOCUMENTS

| | | |
|---|---|---|
| CN | 104853118 A | 8/2015 |
| JP | 2010-259051 A | 11/2010 |
| JP | 2013-254805 A | 12/2013 |
| JP | 2015-167343 A | 9/2015 |

* cited by examiner

FIG. 3

| G/R/B | G/R/B | G/R/B | G/R/B | G/R/B | G/R/B | G/R/B | G/R/B |
|---|---|---|---|---|---|---|---|
| G/R/B | G/R/B | G/R/B | G/R/B | G/R/B | G/R/B | G/R/B | G/R/B |
| G/R/B | G/R/B | G/R/B | G/R/B | G/R/B | G/R/B | G/R/B | G/R/B |
| G/R/B | G/R/B | G/R/B | G/R/B | G/R/B | G/R/B | G/R/B | G/R/B |
| G/R/B | G/R/B | G/R/B | G/R/B | G/R/B | G/R/B | G/R/B | G/R/B |
| G/R/B | G/R/B | G/R/B | G/R/B | G/R/B | G/R/B | G/R/B | G/R/B |
| G/R/B | G/R/B | G/R/B | G/R/B | G/R/B | G/R/B | G/R/B | G/R/B |
| G/R/B | G/R/B | G/R/B | G/R/B | G/R/B | G/R/B | G/R/B | G/R/B |

FIG. 4

| G |
|---|
| R |
| B |

IMAGING ELEMENT, DRIVING METHOD OF IMAGING ELEMENT, AND ELECTRONIC DEVICE

CROSS REFERENCE TO RELATED APPLICATIONS

This application is a U.S. National Phase of International Patent Application No. PCT/JP2016/089037 filed on Dec. 28, 2016, which claims priority benefit of Japanese Patent Application No. JP 2016-004119 filed in the Japan Patent Office on Jan. 13, 2016. Each of the above-referenced applications is hereby incorporated herein by reference in its entirety.

TECHNICAL FIELD

The present technology relates to an imaging element, a driving method of an imaging element, and an electronic device, and more particularly, to an imaging element, a driving method of an imaging element, and an electronic device capable of preventing deterioration in image quality.

BACKGROUND ART

Conventionally, operations to extract a kTC noise component by reading two signals when a reset transistor is turned on and off at the time of a shutter operation and performing correlated double sampling and to remove the kTC noise component extracted from a signal component obtained by a reading operation have been proposed (for example, refer to Patent Document 1).

CITATION LIST

Patent Document

Patent Document 1: Japanese Patent Application Laid-Open No. 2015-167343

SUMMARY OF THE INVENTION

Problems to be Solved by the Invention

By the way, when the reset transistor is switched from on to off at the time of the shutter operation, charges accumulated in a channel unit of the reset transistor move to a charge holding unit. In the invention disclosed in Patent Document 1, a voltage of the charge holding unit varies due to a variation in a moving amount of the charges. Accordingly, it is assumed that noise be generated and image quality be deteriorated.

The present technology has been made in view of such a situation. A purpose of the present technology is to prevent deterioration in image quality.

Solutions to Problems

An imaging element according to a first aspect of the present technology includes a driving unit which drives a unit pixel to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal and a correlated double sampling unit which generates a noise signal by correlated double sampling of the first signal and the second signal, generates a data signal by correlated double sampling of the third signal and the fourth signal, and generates an output signal by correlated double sampling of the data signal and the noise signal, in which, before a reset signal to a gate electrode of the reset transistor is switched from a predetermined on voltage to a predetermined off voltage after the first signal is read, the driving unit sets the reset signal to an intermediate voltage between the on voltage and the off voltage.

A control unit which controls the intermediate voltage on the basis of the noise signal can be further provided.

It is possible that the driving unit sets the intermediate voltage to a plurality of levels and approximates the reset signal from the on voltage to the off voltage in stages.

A control unit can be further provided which controls whether to provide a period in which the reset signal is set to the intermediate voltage on the basis of a comparison result between the noise signal with the third signal or the data signal.

It is possible that the driving unit sets a first transition time when the reset signal to the gate electrode of the reset transistor is switched from the predetermined on voltage to the predetermined off voltage after the first signal is read to be longer than a second transition time when the reset signal is switched from the off voltage to the on voltage after the third signal is read.

A control unit can be further provided which controls the first transition time on the basis of the comparison result between the noise signal with the third signal or the data signal.

A driving method of an imaging element according to the first aspect of the present technology includes driving a unit pixel to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal and setting a reset signal to an intermediate voltage between an on voltage and an off voltage before the reset signal to a gate electrode of the reset transistor is switched from the predetermined on voltage to the predetermined off voltage after the first signal is read, generating a noise signal by correlated double sampling of the first signal and the second signal, generating a data signal by correlated double sampling of the third signal and the fourth signal, and generating an output signal by correlated double sampling of the data signal and the noise signal.

An electronic device according to a second aspect of the present technology includes an imaging element including a driving unit which drives a unit pixel to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal and a correlated double sampling unit which generates a noise signal by correlated double sampling of the first signal and the second signal, generates a data signal by correlated double sampling of the third signal and the fourth signal, and generates an output signal by correlated double sampling of the data signal and the noise signal, in which before a reset signal to a gate electrode of the reset transistor is switched from a predetermined on voltage to a predetermined off voltage after the first signal is read, the driving unit sets the reset signal to an intermediate voltage between the on voltage and the off voltage, and a signal processing unit which performs processing on the output signal.

An imaging element according to a third aspect of the present technology includes a driving unit which drives a unit pixel to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal and a correlated double sampling unit which generates a noise signal by correlated double sampling of the first signal and the second signal, generates a data signal by correlated double sampling of the third signal and the fourth signal, and generates an output signal by correlated double sampling of the data signal and the noise signal, in which a potential gradient of the channel unit of the reset transistor prevents movement of charges from the channel unit to the charge holding unit when the reset transistor is turned off.

The potential gradient of the channel unit can be formed depending on an impurity concentration of the channel unit.

The potential gradient of the channel unit can be formed depending on a change in a work function of the gate electrode of the reset transistor.

A driving method of an imaging element according to a third aspect of the present technology includes driving a unit pixel to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal and preventing movement of charges from the channel unit to the charge holding unit when the reset transistor is turned off by a potential gradient of the channel unit of the reset transistor and generating a noise signal by correlated double sampling of the first signal and the second signal, generating a data signal by correlated double sampling of the third signal and the fourth signal, and generating an output signal by correlated double sampling of the data signal and the noise signal.

An electronic device according to a fourth aspect of the present technology includes an imaging element which includes a driving unit which drives a unit pixel to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal and a correlated double sampling unit which generates a noise signal by correlated double sampling of the first signal and the second signal, generates a data signal by correlated double sampling of the third signal and the fourth signal, and generates an output signal by correlated double sampling of the data signal and the noise signal, and a signal processing unit which performs processing on the output signal, in which a potential gradient of the channel unit of the reset transistor prevents movement of charges from the channel unit to the charge holding unit when the reset transistor is turned off.

An imaging element according to a fifth aspect of the present technology includes a driving unit which drives a unit pixel to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal and a correlated double sampling unit which generates a noise signal by correlated double sampling of the first signal and the second signal, generates a data signal by correlated double sampling of the third signal and the fourth signal, and generates an output signal by correlated double sampling of the data signal and the noise signal, in which variation in an amount of charges for moving from the channel unit of the reset transistor to the charge holding unit when the reset transistor is turned off after the first signal is read is reduced.

A driving method of an imaging element according to the fifth aspect of the present technology includes driving a unit pixel to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal and reducing variation in an amount of charges for moving from the channel unit of the reset transistor to the charge holding unit when the reset transistor is turned off after the first signal is read and generating a noise signal by correlated double sampling of the first signal and the second signal, generating a data signal by correlated double sampling of the third signal and the fourth signal, and generating an output signal by correlated double sampling of the data signal and the noise signal.

An electronic device according to a sixth aspect of the present technology includes an imaging element including a driving unit which drives a unit pixel to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal and a correlated double sampling unit which generates a noise signal by correlated double sampling of the first signal and the second signal, generates a data signal by correlated double sampling of the third signal and the fourth signal, and generates an output signal by correlated double sampling of the data signal and the noise signal and a signal processing unit which performs processing on the output signal, in which variation in an amount of charges for moving from the channel unit of the reset transistor to the charge holding unit when the reset transistor is turned off after the first signal is read is reduced.

In the first aspect of the present technology, a unit pixel is driven so as to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal and a reset signal is set to an intermediate voltage between an on voltage and an off voltage before the reset signal to a gate electrode of the reset transistor is switched from the predetermined on voltage to the predetermined off voltage after the first signal is read, a noise signal is generated by correlated double sampling of the first signal and the second signal, a data signal is generated by correlated double sampling of the third signal and the fourth signal, and an output signal is generated by correlated double sampling of the data signal and the noise signal.

In the second aspect of the present technology, a unit pixel is driven so as to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal and a reset signal is set to an intermediate voltage between an on voltage and an off voltage before the reset signal to a gate electrode of the reset transistor is switched from the predetermined on voltage to the predetermined off voltage after the first signal is read, a noise signal is generated by correlated double sampling of the first signal and the second signal, a data signal is generated by correlated double sampling of the third signal and the fourth signal, an output signal is generated by correlated double sampling of the data signal and the noise signal, and processing on the output signal is performed.

In the third aspect of the present technology, a unit pixel is driven to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal and movement of charges from the channel unit to the charge holding unit when the reset transistor is turned off is prevented by a potential gradient of the channel unit of the reset transistor, a noise signal is generated by correlated double sampling of the first signal and the second signal, a data signal is generated by correlated double sampling of the third signal and the fourth signal, and an output signal is generated by correlated double sampling of the data signal and the noise signal.

In the fourth aspect of the present technology, a unit pixel is driven to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal and movement of charges from the channel unit to the charge holding unit when the reset transistor is turned off is prevented by a potential gradient of the channel unit of the reset transistor, a noise signal is generated by correlated double sampling of the first signal and the second signal, a data signal is generated by correlated double sampling of the third signal and the fourth signal, an output signal is generated by correlated double sampling of the data signal and the noise signal, and processing on the output signal is performed.

In the fifth aspect of the present technology, a unit pixel is driven to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal and variation in an amount of charges for moving from the channel unit of the reset transistor to the charge holding unit when the reset transistor is turned off after the first signal is read is reduced, a noise signal is generated by correlated double sampling of the first signal and the second signal, a data signal is generated by correlated double sampling of the third signal and the fourth signal, and an output signal is generated by correlated double sampling of the data signal and the noise signal.

In the sixth aspect of the present technology, a unit pixel is driven to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal and variation in an amount of charges for moving from the channel unit of the reset transistor to the charge holding unit when the reset transistor is turned off after the first signal is read is reduced, a noise signal is generated by correlated double sampling of the first signal and the second signal, a data signal is generated by correlated double sampling of the third signal and the fourth signal, an output signal is generated by correlated double sampling of the data signal and the noise signal, and processing on the output signal is performed.

Effects of the Invention

According to the first to sixth aspects of the present technology, a signal can be processed. In particular, according to the first to sixth aspects of the present technology, deterioration of image quality can be prevented.

BRIEF DESCRIPTION OF DRAWINGS

FIG. 3 is a diagram an exemplary pixel arrangement.

FIG. 4 is a diagram of an exemplary pixel structure.

MODE FOR CARRYING OUT THE INVENTION

Embodiments for carrying out the present disclosure (referred to as embodiment below) will be described below. Note that, the description will be made in the following order.

1. First Embodiment (First Embodiment of Imaging Element)

2. Second Embodiment (Details of Imaging Element according to First Embodiment)

3. Third Embodiment (Second Embodiment of Imaging Element)

4. Fourth Embodiment (First Embodiment of Reset Transistor)

5. Fifth Embodiment (Second Embodiment of Reset Transistor)

6. Sixth Embodiment (Second Embodiment of Unit Pixel)

7. Seventh Embodiment (Third Embodiment of Imaging Element)

8. Application Example

1. First Embodiment

<Imaging Element>

Figure 1:
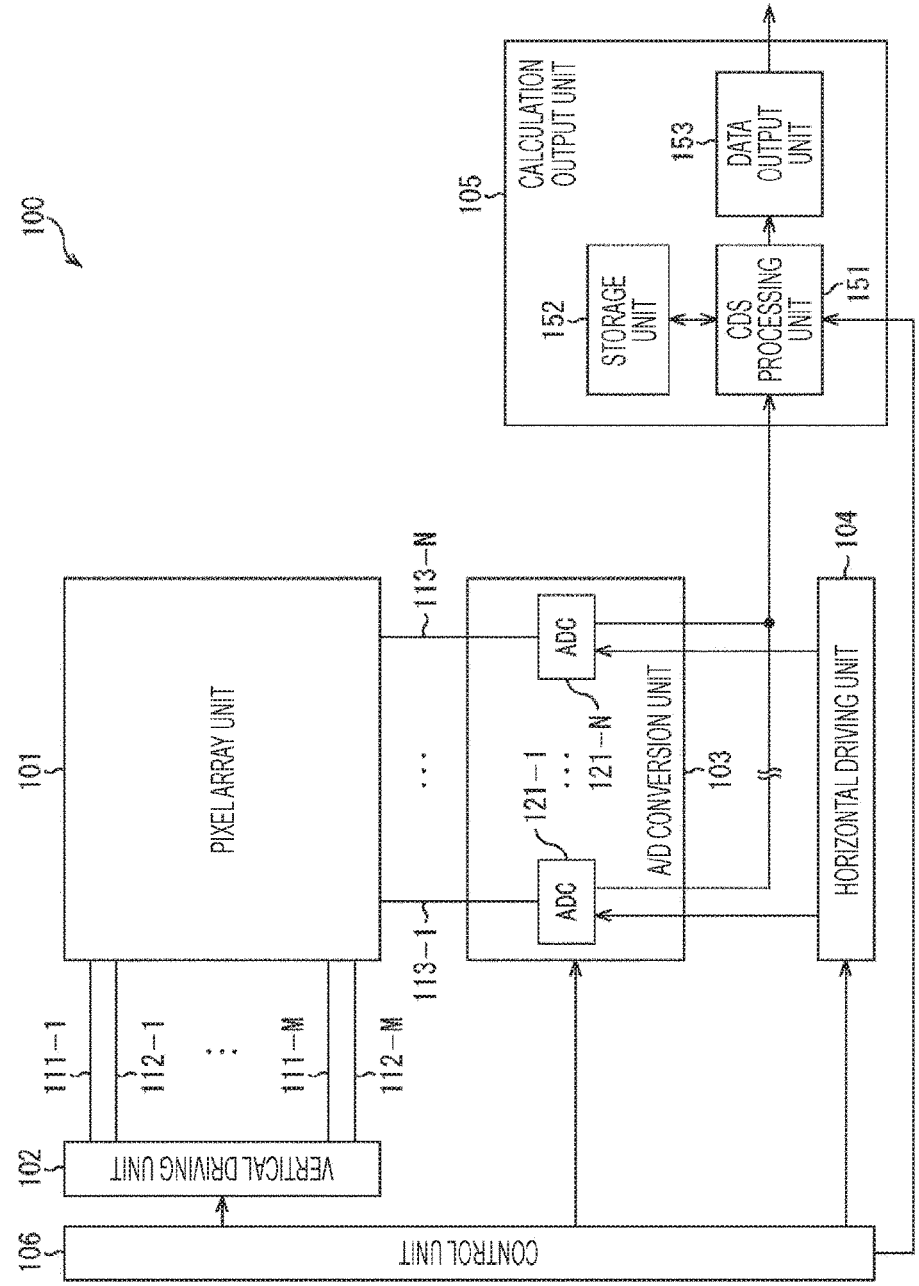
FIG. 1 is a diagram of a main configuration example of a first embodiment of an imaging element.

FIG. 1 is a diagram of a main configuration example of an imaging element according to a first embodiment of the present technology. An imaging element 100 illustrated in FIG. 1 is, for example, an image sensor such as a Charge Coupled Device (CCD) and a Complementary Metal Oxide Semiconductor (CMOS). The imaging element 100 images a subject and performs photoelectric conversion and the like to output the imaged image of the subject to the outside as image data (imaged image data).

As illustrated in FIG. 1, the imaging element 100 includes a pixel array unit 101, a vertical driving unit 102, an A/D conversion unit 103, a horizontal driving unit 104, a calculation output unit 105, and a control unit 106.

The pixel array unit 101 is a region where pixels for receiving light from outside, performing the photoelectric conversion on the light, and outputting the photoelectrically-converted light as an electric signal are provided. In the pixel array unit 101, a plurality of unit pixels is arranged in a predetermined pattern, for example, in a matrix. The unit pixel includes a photoelectric conversion element, and the like. The number of unit pixels (that is, the number of pixels) arranged in the pixel array unit 101 and an arrangement pattern are arbitrary. For example, in a case where the unit pixels are arranged in a matrix, the number of rows and the number of columns are also arbitrary. A configuration of the unit pixel will be described later. The electric signal read out from the unit pixel of the pixel array unit 101 is supplied to the A/D conversion unit 103.

Furthermore, in the pixel array unit 101, for example, reset lines 111-1 to 111-M and row selection lines 112-1 to 112-M (M is arbitrary natural number) are formed along an arrangement direction of the pixels in the pixel row (horizontal direction in FIG. 1) for the respective rows in the matrix pixel arrangement. Furthermore, for example, vertical signal lines 113-1 to 113-N (N is arbitrary natural number) are formed along an arrangement direction of the pixels in the pixel column (vertical direction in FIG. 1) for the respective columns.

Note that, hereinafter, in a case where it is not necessary to individually distinguish the reset lines 111-1 to 111-M, the row selection lines 112-1 to 112-M, and the vertical signal lines 113-1 to 113-N, the above respective lines are simply referred to as a reset line 111, a row selection line 112, and a vertical signal line 113.

The vertical driving unit 102 controls an operation of each unit pixel in the pixel array unit 101 on the basis of control of the control unit 106. For example, the vertical driving unit 102 supplies a reset signal (RST), which is used to reset the charges accumulated in each pixel, to each pixel of the pixel array unit 101 for each row via the reset lines 111-1 to 111-M. Furthermore, for example, the vertical driving unit 102 supplies a selection signal (SEL), which is used to select the pixel from which the signal is read, to each pixel of the pixel array unit 101 for each row via the row selection lines 112-1 to 112-M.

The A/D conversion unit 103 performs A/D conversion on the signal (analog signal) read from the unit pixel of the pixel array unit 101 on the basis of the control of the control unit 106. The A/D conversion unit 103 includes a plurality of Analog Digital Converters (ADC) (ADC 121-1 to ADC 121-N).

Different unit pixels of the pixel array unit 101 are respectively allocated to the ADCs 121-1 to 121-N. For example, in a case where the unit pixels are arranged in a matrix in the pixel array unit 101, the unit pixels in different columns may be respectively allocated to the ADCs 121-1 to 121-N. Furthermore, the unit pixels in different portions (area) may be respectively allocated to the ADCs 121-1 to 121-N. Note that, in the following description, a case where the unit pixels in the different columns are respectively allocated to the ADCs 121-1 to 121-N will be described.

Each of the ADCs 121-1 to 121-N performs AD conversion on analog signals supplied from the unit pixels allocated to each of the ADCs 121-1 to 121-N. For example, the ADCs 121-1 to 121-N perform the A/D conversion on the signals supplied from the unit pixels in each column so that the A/D conversion unit 103 can perform the A/D conversion on the signals supplied from all the unit pixels in the pixel array unit 101 (that is, can perform A/D conversion on signals for one picture).

The A/D conversion unit 103 (ADCs 121-1 to 121-N) sequentially supplies digital data, corresponding to each unit pixel, obtained by the A/D conversion to a CDS processing unit 151.

Note that, hereinafter, in a case where it is not necessary to individually distinguish the ADCs 121-1 to 121-N from each other, the ADCs 121-1 to 121-N are simply referred to as an ADC 121.

The horizontal driving unit 104 controls operations of the ADCs 121-1 to 121-N (A/D conversion, transfer of A/D converted data, and the like) on the basis of the control of the control unit 106.

Accordingly, according to the control of the vertical driving unit 102 and the horizontal driving unit 104 controlled by the control unit 106, the signal is read from each unit pixel of the pixel array unit 101 and is A/D converted.

The calculation output unit 105 includes the Correlated Double Sampling (CDS) processing unit 151, a storage unit 152, and a data output unit 153.

By using the storage unit 152, the CDS processing unit 151 performs Correlated Double Sampling (CDS) by using a plurality of pieces of digital data respectively supplied at different timings. For example, the CDS processing unit 151 makes the storage unit 152 store the supplied digital data and reads the digital data from the storage unit 152 at a predetermined timing and performs the correlated double sampling. Furthermore, for example, the CDS processing unit 151 makes the storage unit 152 store the processing result of the correlated double sampling. Then, the CDS processing unit 151 reads the processing result from the storage unit 152 at a predetermined timing and performs the correlated double sampling again to obtain a new processing result.

The CDS processing unit 151 supplies the processing result of the correlated double sampling obtained in this way to the data output unit 153 as an output signal.

The storage unit 152 includes an arbitrary storage medium, for example, a semiconductor memory such as a flash memory, a Random Access Memory (RAM), and a Solid State Drive (SSD), a hard disk, and the like and stores the data supplied from the CDS processing unit 151. Furthermore, the storage unit 152 supplies the storing data to the CDS processing unit 151 on the basis of a request from the CDS processing unit 151.

The data output unit 153 includes an external terminal and the like and outputs the output signal supplied from the CDS processing unit 151 to the outside of the imaging element 100. Note that the data output unit 153 may output the output signal after encoding the output signal by a predetermined encoding method.

The control unit 106 controls operations of units in the imaging element 100, for example, the vertical driving unit 102, the A/D conversion unit 103, the horizontal driving unit 104, the CDS processing unit 151, and the like.

<Unit Pixel Configuration>

Figure 2:
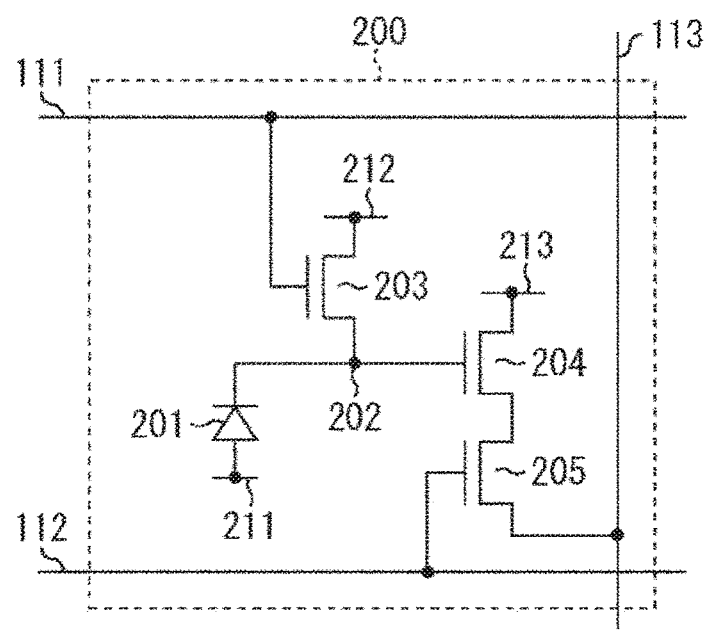
FIG. 2 is a diagram of a main configuration example of a first embodiment of a unit pixel.

FIG. 2 is a diagram of a main configuration example of the unit pixel 200 formed in the pixel array unit 101 in FIG. 1. As illustrated in FIG. 2, the unit pixel 200 includes a photoelectric conversion element 201, a charge holding unit 202, a reset transistor 203, an amplification transistor 204, and a selection transistor 205.

The photoelectric conversion element 201 includes, for example, a photodiode. The photoelectric conversion element 201 receives light entering the unit pixel 200, performs photoelectric conversion on the received light into charges (here, photoelectron) having a charge amount according to the light amount, and accumulates the charges. An anode electrode of the photoelectric conversion element 201 is connected to a pixel power supply 211 (connection line connected thereto), and a cathode electrode is connected to the charge holding unit 202.

The charge holding unit 202 includes, for example, a floating diffusion (FD), and accumulates the charges generated in the photoelectric conversion element 201.

The reset transistor 203 resets potentials of gate electrodes of the charge holding unit 202 and the amplification transistor 204. A drain electrode of the reset transistor 203 is connected to a pixel power supply 212 (connection line connected thereto), and a source electrode is connected to the charge holding unit 202. Furthermore, a reset signal is applied from the vertical driving unit 102 (FIG. 1) to a gate electrode of the reset transistor 203 via the reset line 111.

The amplification transistor (AMP) 204 amplifies a potential change of the charge holding unit 202 with a PN junction capacitance, a gate capacitance, and the like, and outputs the amplified potential as an electric signal (analog signal). A gate electrode of the amplification transistor 204 is connected to the charge holding unit 202, a drain electrode is connected to a pixel power supply 213 (connection line connected thereto), and a source electrode is connected to a drain electrode of the selection transistor 205.

The selection transistor 205 controls an output of the electric signal supplied from the amplification transistor 204 to the vertical signal line 113. The drain electrode of the selection transistor 205 is connected to a source electrode of the amplification transistor 204, and a source electrode is connected to the vertical signal line 113. Furthermore, the selection signal is applied from the vertical driving unit 102 (FIG. 1) to a gate electrode of the selection transistor 205 via the row selection line 112.

<Pixel Arrangement>

In the pixel array unit 101, for example, the unit pixels 200 having the configuration as in FIG. 2 are arranged in a matrix (array) as in the example illustrated in FIG. 3.

<Pixel Structure>

Furthermore, as illustrated in FIG. 4, the unit pixel 200 (photoelectric conversion element 201) has a so-called vertical spectroscopic structure which can be separated into colors in a substrate vertical direction (depth direction). Furthermore, in the structure of the example in FIG. 4, for example, the unit pixel 200 (photoelectric conversion element 201) may color-separate green by using an organic photoelectric conversion film and color-separate red and blue depending on a depth of a silicon. Furthermore, for example, the unit pixel 200 (photoelectric conversion element 201) may color-separate green, red, and blue depending on the depth of the silicon.

In this way, the unit pixel 200 has a vertical spectroscopic structure so as to hold color information of a plurality of colors per pixel. According to this, in comparison with a simple plate type, it is expected that pixel characteristics are improved because the light can be efficiently used and false colors are not generated because demosaic processing is not required.

<Complete Depletion>

Furthermore, as illustrated in FIG. 2, the photoelectric conversion element 201 (organic photoelectric conversion film thereof) having the above structure is connected to the charge holding unit 202 with a metal. Therefore, the photoelectric conversion element 201 is not completely depleted. As a result, kTC noises are increased, and the kTC noise which cannot be removed adversely affects RN noises of the imaging element, and image quality of the imaged image obtained by the imaging element may be deteriorated.

<Reading>

Figure 5:
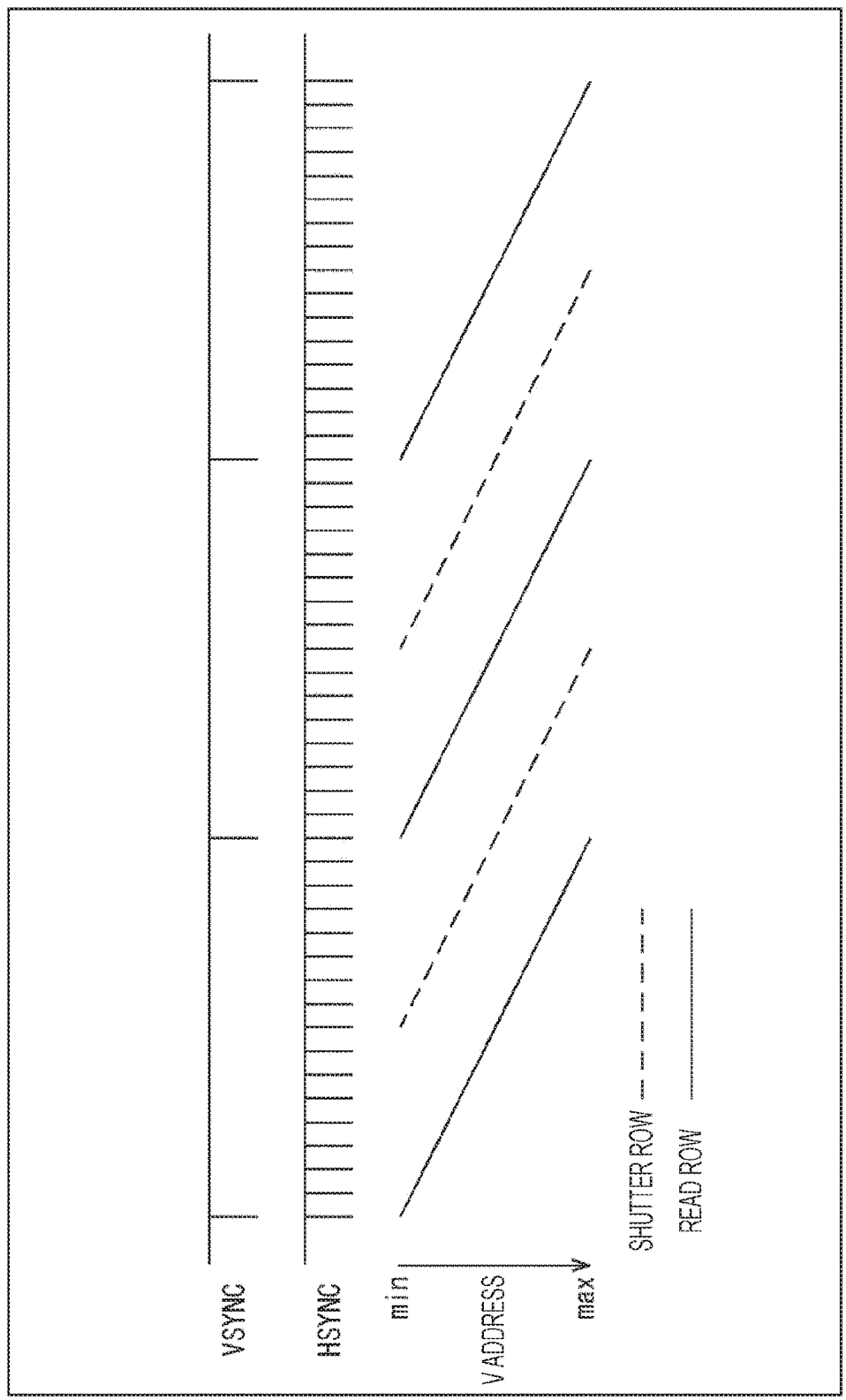
FIG. 5 is a timing chart to describe an exemplary state of pixel reading.

FIG. 5 is a timing chart to describe an exemplary state signal reading from the unit pixel 200 as described above.

As illustrated in FIG. 5, in the imaging element 100, reading from each unit pixel is performed during a shutter operation and a read operation. The shutter operation is an operation for resetting the charge holding unit 202, and the read operation is an operation for reading the charges obtained by photoelectric conversion from the charge holding unit 202. As illustrated in FIG. 5, in each unit pixel 200, the shutter operations and the read operations are alternately performed. That is, a signal corresponding to the charges photoelectrically converted and accumulated after the charge holding unit 202 has been reset by the shutter operation is read by the read operation.

<Reading Control Processing>

In the imaging element 100 which reads the signal by the above procedure from the unit pixel 200 having the above configuration, the control unit 106 controls each unit by performing the reading control processing as follows and reads the signal form each unit pixel. An exemplary flow of the reading control processing will be described with reference to the flowchart in FIG. 6. This will be described with reference to FIG. 7 as necessary.

When the reading control processing is started, in step S101, the control unit 106 controls the vertical driving unit 102 to set the reset signal to High (H) as the shutter operation and controls the unit pixel 200 to perform an Auto Zero (AZ: match references of reference signal having a ramp waveform (ramp signal) and pixel signal input via vertical signal line 113) operation in that state. That is, in step S101, the vertical driving unit 102 sets the reset signal to H relative to the unit pixel 200 in a shutter row which is a target of the shutter operation and turns on the reset transistor 203. This starts a reset period in which the charges accumulated in the charge holding unit 202 are reset. Furthermore, each unit of the unit pixel 200 in the shutter row performs the AZ operation in a state where the reset signal is H and reads a pixel signal VShigh.

In step S102, the control unit 106 controls the A/D conversion unit 103 via the horizontal driving unit 104 and makes the A/D conversion unit 103 perform the A/D conversion on the pixel signal VShigh read from the unit pixel in each column by the processing in step S101. That is, in step S102, the A/D conversion unit 103 performs the A/D conversion on the pixel signal VShigh read from the unit pixel in each column.

Figure 7:
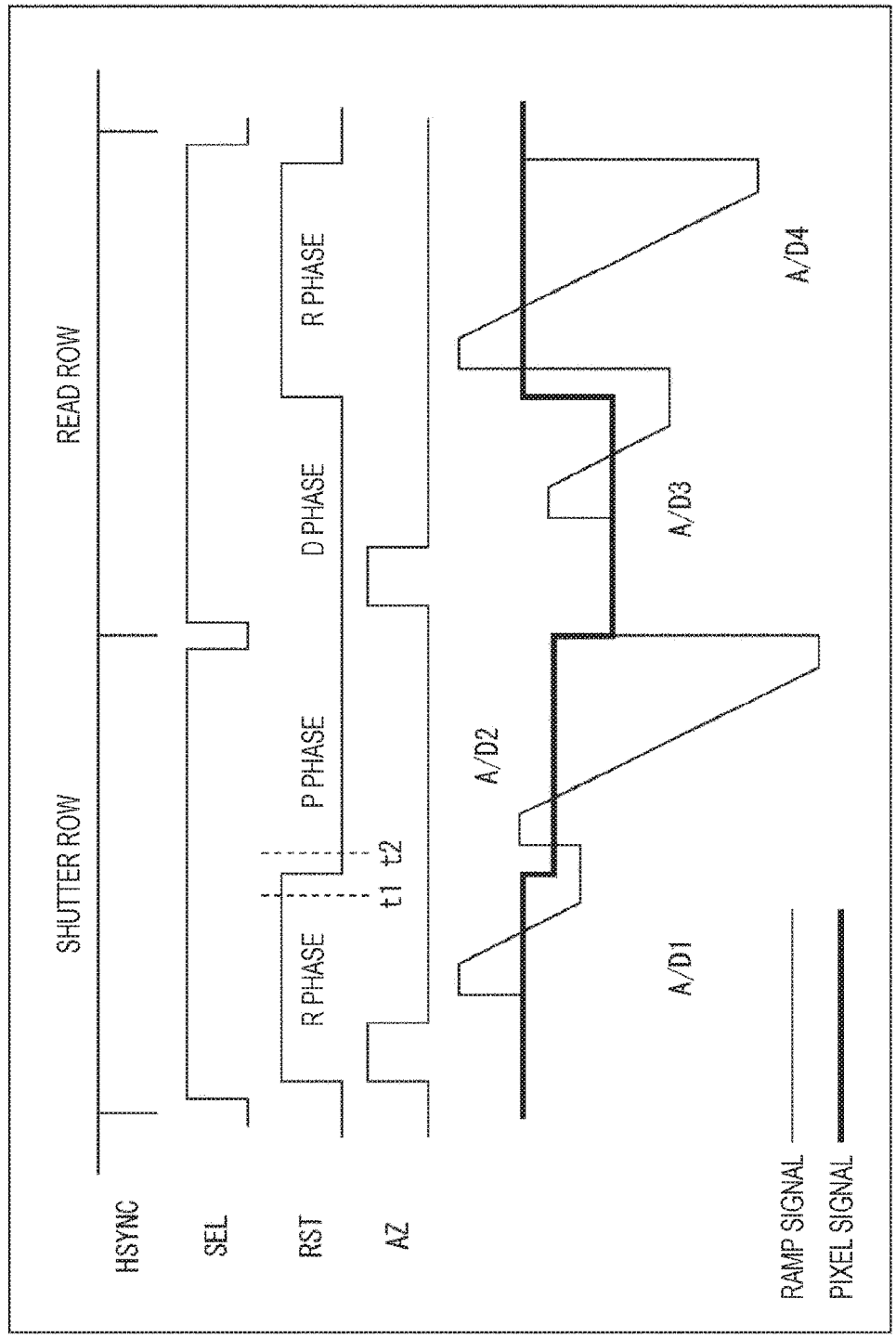
FIG. 7 is a timing chart to describe an exemplary drive state at the time of the pixel reading.

With this processing, an A/D conversion result of the portion (R phase) of "A/D1" in FIG. 7 is obtained.

In step S103, the control unit 106 controls the storage unit 152 via the CDS processing unit 151 and makes the storage unit 152 store digital data of the pixel signal VShigh which is the A/D conversion result obtained by the processing in step S102. That is, in step S103, the storage unit 152 stores the digital data of the supplied pixel signal VShigh.

In step S104, as the shutter operation, the control unit 106 controls the vertical driving unit 102 and makes the vertical driving unit 102 set the reset signal to Low (L), and controls the unit pixel 200 and makes the unit pixel 200 read the signal in that state. That is, in step S104, the vertical driving unit 102 switches the reset signal to L relative to the unit pixel 200 in the shutter row and turns off the reset transistor 203. This terminates the reset period and starts an accumulation period in which the charge generated by the photoelectric conversion element 201 is accumulated in the charge holding unit 202. Furthermore, each unit of the unit pixel 200 in the shutter row reads a pixel signal VSlow in a state where the reset signal is L.

Furthermore, at this time, as will be described later, when the reset transistor 203 is turned off (referred to as reset off below), the reset signal is controlled so that variation in the amount of charges which move from a channel unit of the reset transistor 203 to the charge holding unit 202 is reduced and the variation in potentials of the charge holding unit 202 after the reset off is reduced.

In step S105, the control unit 106 controls the A/D conversion unit 103 via the horizontal driving unit 104 and makes the A/D conversion unit 103 perform the A/D conversion on the pixel signal VSlow read from the unit pixel in each column by the processing in step S104. That is, in step S105, the A/D conversion unit 103 performs the A/D conversion on the pixel signal VSlow read from the unit pixel in each column.

With this processing, an A/D conversion result of the portion (P phase) of "A/D2" in FIG. 7 is obtained.

In step S106, the control unit 106 controls the storage unit 152 via the CDS processing unit 151 and makes the storage unit 152 store digital data of the pixel signal VSlow which is the A/D conversion result obtained by the processing in step S105. That is, in step S106, the storage unit 152 stores the digital data of the supplied pixel signal VSlow.

In step S107, the control unit 106 controls the CDS processing unit 151 and makes the CDS processing unit 151 read the digital data of the A/D conversion result stored in the storage unit 152 in steps S103 and S106. Then, the control unit 106 makes the CDS processing unit 151 perform the correlated double sampling on the shutter row by using the read data. That is, in step S107, the CDS processing unit 151 reads the digital data of the pixel signals VShigh and VSlow stored in the storage unit 152 in steps S103 and S106 and performs the correlated double sampling on the shutter row by using the read data. With this processing, a noise signal Vn which is an A/D conversion result corresponding to the kTC noise is obtained.

In step S108, the control unit 106 controls the storage unit 152 via the CDS processing unit 151 and makes the storage unit 152 store a CDS result (that is, A/D conversion result corresponding to kTC noise) obtained by the processing in step S107. That is, in step S108, the storage unit 152 stores the noise signal Vn that is the supplied CDS result.

Next, in step S109, as the read operation, the control unit 106 controls the unit pixel 200 and makes the unit pixel 200 perform the AZ operation in a state where the reset signal is L. That is, in step S109, in each unit of the unit pixel 200 in the read row which is a target row of the read operation, the reset signal is set to L, and the unit pixel 200 performs the AZ operation in a state where the reset transistor 203 is turned off and reads a pixel signal VRlow.

In step S110, the control unit 106 controls the A/D conversion unit 103 via the horizontal driving unit 104 and makes the A/D conversion unit 103 perform the A/D conversion on the pixel signal VRlow read from the unit pixel in each column by the processing in step S109. That is, in step S110, the A/D conversion unit 103 performs the A/D conversion on the pixel signal VRlow read from the unit pixel in each column.

With this processing, an A/D conversion result of the portion (D phase) of "A/D3" in FIG. 7 is obtained.

In step S111, the control unit 106 controls the storage unit 152 via the CDS processing unit 151 and makes the storage unit 152 store digital data of the pixel signal VRlow which is the A/D conversion result obtained by the processing in step S110. That is, in step S111, the storage unit 152 stores the digital data of the supplied pixel signal VRlow.

In step S112, as the read operation, the control unit 106 controls the vertical driving unit 102 and makes the vertical driving unit 102 set the reset signal to H, and controls the unit pixel 200 and makes the unit pixel 200 read the signal in that state. That is, in step S112, the vertical driving unit 102 switches the reset signal to H relative to the unit pixel 200 in the read row and turns on the reset transistor 203. With this processing, the accumulation period is terminated. Furthermore, each unit of the unit pixel 200 in the read row reads a pixel signal VRhigh in a state where the reset signal is H.

In step S113, the control unit 106 controls the A/D conversion unit 103 via the horizontal driving unit 104 and makes the A/D conversion unit 103 perform the A/D conversion on the pixel signal VRhigh read from the unit pixel in each column by the processing in step S112. That is, in step S113, the A/D conversion unit 103 performs the A/D conversion on the pixel signal VRhigh read from the unit pixel in each column.

With this processing, an A/D conversion result of the portion (R phase) of "A/D4" in FIG. 7 is obtained.

In step S114, the control unit 106 controls the storage unit 152 via the CDS processing unit 151 and makes the storage unit 152 store digital data of the pixel signal VRhigh which is the A/D conversion result obtained by the processing in step S113. That is, in step S114, the storage unit 152 stores the digital data of the supplied pixel signal VRhigh.

In step S115, the control unit 106 controls the CDS processing unit 151 and makes the CDS processing unit 151 read the digital data of the A/D conversion result stored in the storage unit 152 in steps S111 and S114. Then, the control unit 106 makes the CDS processing unit 151 perform the correlated double sampling on the read row by using the read data. That is, in step S115, the CDS processing unit 151 reads the digital data of the pixel signals VRlow and VRhigh stored in the storage unit 152 in steps S111 and S114 and performs the correlated double sampling on the read row by using the read data. With this processing, a data signal Vd is obtained which is an A/D conversion result corresponding to an amount of the charges which have been photoelectrically converted according to the kTC noise and a predetermined accumulation time.

In step S116, the control unit 106 controls the storage unit 152 via the CDS processing unit 151, reads the CDS processing unit (that is, A/D conversion result (noise signal Vn) corresponding to kTC noise) stored in the storage unit 152 in step S108 and performs the correlated double sampling by using the CDS result and the CDS result obtained by the processing in step S115 (that is, A/D conversion result (data signal Vd) corresponding to amount of charges photoelectrically converted according to kTC noise and predetermined accumulation time). That is, in step S116, the CDS processing unit 151 reads the noise signal Vn from the storage unit 152 and performs the correlated double sampling by using the noise signal Vn and the data signal Vd. For example, the CDS processing unit 151 subtracts the noise signal Vn from the data signal Vd. By this processing, an output signal Vout which is an A/D conversion result corresponding to the amount of the charges, which are photoelectrically converted according to a predetermined accumulation time, with sufficiently reduced kTC noise is obtained.

In step S117, the control unit 106 controls the CDS processing unit 151 and supplies the output signal Vout obtained in step S116 to the data output unit 153. Then, the control unit 106 makes the data output unit 153 output the received signal to the outside of the imaging element 100. That is, in step S117, the data output unit 153 outputs the output signal Vout supplied from the CDS processing unit 151 to the outside.

When the processing in step S117 is completed, the reading control processing is completed.

By performing the above reading control processing, the imaging element 100 (CDS processing unit 151) can output the A/D conversion result (output signal Vout) corresponding to the amount of the charges, which are photoelectrically converted according to a predetermined accumulation time, with the sufficiently reduced kTC noise to the outside as imaged image data. Therefore, the imaging element 100 can prevent deterioration in the image quality of the imaged image due to the kTC noise and the like.

With reference to FIGS. 8 to 12, an exemplary method of controlling the reset signal at the time of the reset off in step S104 will be described. Note that, hereinafter, a voltage of the reset signal in a case where the reset signal is set to H is referred to as an on voltage Von, and a voltage of the reset signal in a case where the reset signal is set to L is referred to as an off voltage Voff.

Figure 8:
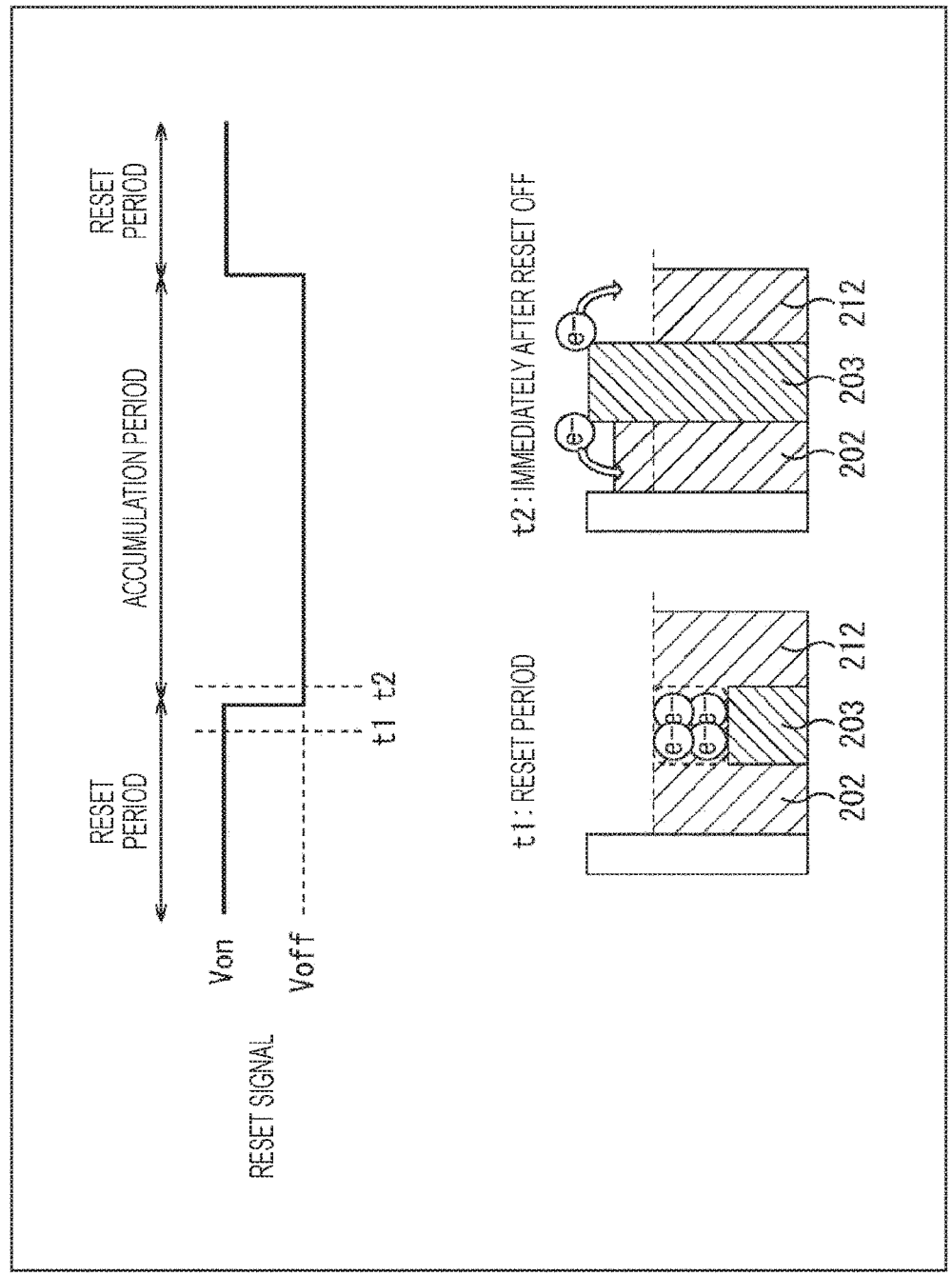
FIG. 8 is a diagram to describe a movement of charges to a charge holding unit at the time of reset off.

An upper diagram of FIG. 8 is a timing chart of the reset signal. A diagram on a lower left side of FIG. 8 schematically illustrates potentials of the charge holding unit 202, the channel unit of the reset transistor 203, and the pixel power supply 212 at a time t1 in the reset period. A diagram on a lower right side of FIG. 8 schematically illustrates potentials of the charge holding unit 202, the channel unit of the reset transistor 203, and the pixel power supply 212 at a time t2 immediately after the reset off. Note that the times t1 and t2 in FIG. 8 respectively correspond to times t1 and t2 in FIG. 7.

In this example, the reset signal is simply switched from the on voltage Von to the off voltage Voff at the time of the reset off.

Specifically, at the time t1, the reset signal is set to the on voltage Von, and a resistance of the channel unit of the reset transistor 203 is sufficiently low. With this structure, the charge holding unit 202 is certainly reset, and thermal noises caused by the resistance of the channel unit of the reset transistor 203 generated when the pixel signal VShigh is read are reduced.

Furthermore, at the time t1, negative charges (electron) are accumulated in the channel unit of the reset transistor 203.

Then, when the reset signal is switched from the on voltage Von to the off voltage Voff and the reset transistor 203 is turned off, the charges in the channel unit move to the charge holding unit 202 and the pixel power supply 212. With this movement, at the time t2 immediately after the reset off, the potential of the charge holding unit 202 changes from the potential of the pixel power supply 212 according to the amount of the charges that flowed in the charge holding unit 202. Therefore, the noise signal Vn corresponding to the kTC noise depends on the amount of the charges which move from the channel unit of the reset transistor 203 to the charge holding unit 202 at the time of the reset off.

Furthermore, a dark current generated in the charge holding unit 202 in the accumulation period depends on the potential of the charge holding unit 202. Therefore, when the amount of the charges for moving to the charge holding unit 202 at the time of the reset off varies, shading of the dark current, a white spot, a black point, and the like are generated.

On the other hand, as illustrated in FIG. 8, when the reset signal is simply switched from the on voltage Von to the off voltage Voff in a state where a large amount of charges is accumulated in the channel unit of the reset transistor 203 at the time of the reset off, the amount of the charges for moving to the charge holding unit 202 largely varies.

Figure 9:
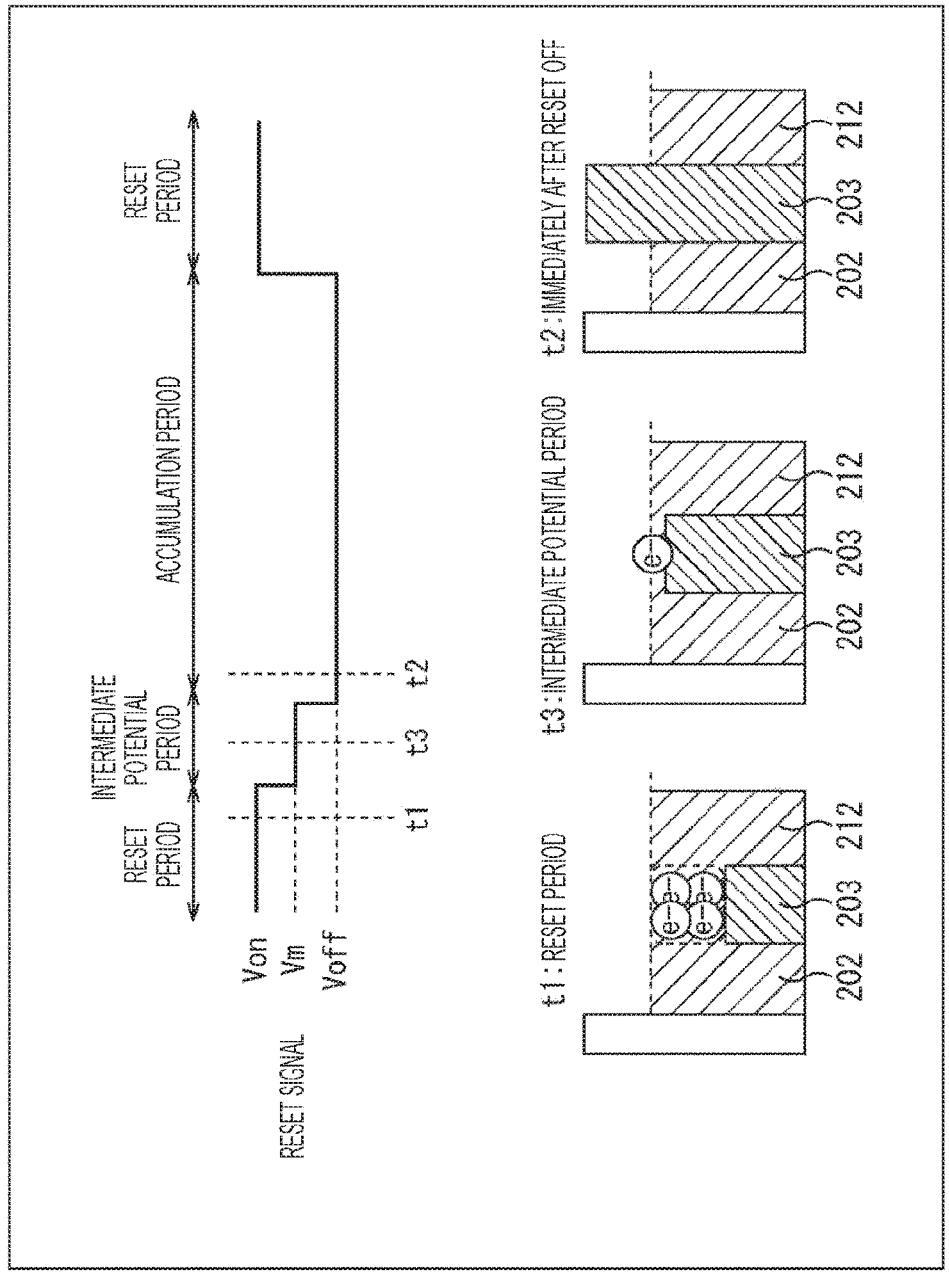
FIG. 9 is a diagram to describe a first example of a control method of a reset signal at the time of the reset off.

Whereas, in FIG. 9, a first example of a method of reducing the variation in the amount of the charges for moving to the charge holding unit 202 at the time of the reset off is illustrated.

An upper diagram of FIG. 9 is a timing chart of the reset signal. A diagram on a lower left side of FIG. 9 schematically illustrates potentials of the charge holding unit 202, the channel unit of the reset transistor 203, and the pixel power supply 212 at a time t1 in the reset period. A diagram in a lower middle portion of FIG. 9 schematically illustrates potentials of the charge holding unit 202, the channel unit of the reset transistor 203, and the pixel power supply 212 at a time t3 in an intermediate potential period between the reset period and the accumulation period. A diagram on a lower right side of FIG. 9 schematically illustrates potentials of the charge holding unit 202, the channel unit of the reset transistor 203, and the pixel power supply 212 at a time t2 immediately after the reset off.

In the example in FIG. 9, a point is different from the example in FIG. 8 in that the intermediate potential period is provided between the reset period and the accumulation period and the reset signal is set to an intermediate voltage Vm between the on voltage Von and the off voltage Voff in the intermediate potential period.

In this way, by setting the voltage of the reset signal to the intermediate voltage Vm before switching from the on voltage Von to the off voltage Voff, the potential of the charge holding unit 202 is reset to the potential of the pixel power supply 212 in a state where the amount of the charges accumulated in the channel unit of the reset transistor 203 is smaller.

Then, when the reset signal is switched from the intermediate voltage Vm to the off voltage Voff and the reset transistor 203 is turned off, the charges in the channel unit move to the charge holding unit 202 and the pixel power supply 212. At this time, since the amount of the charges accumulated in the channel unit of the reset transistor 203 is reduced in comparison with that in the reset period, variation in the amount of the charges for moving to the charge holding unit 202 can be reduced. Furthermore, an electric field between the channel unit of the reset transistor 203 and a well is relaxed. Therefore, the variation in the potential of the charge holding unit 202 at the time t2 immediately after the reset off is reduced. As a result, generation of the dark current shading, the white spot, the black spot, and the like is suppressed.

Here, an exemplary method of determining the intermediate voltage Vm will be described with reference to FIG. 10.

Figure 10:
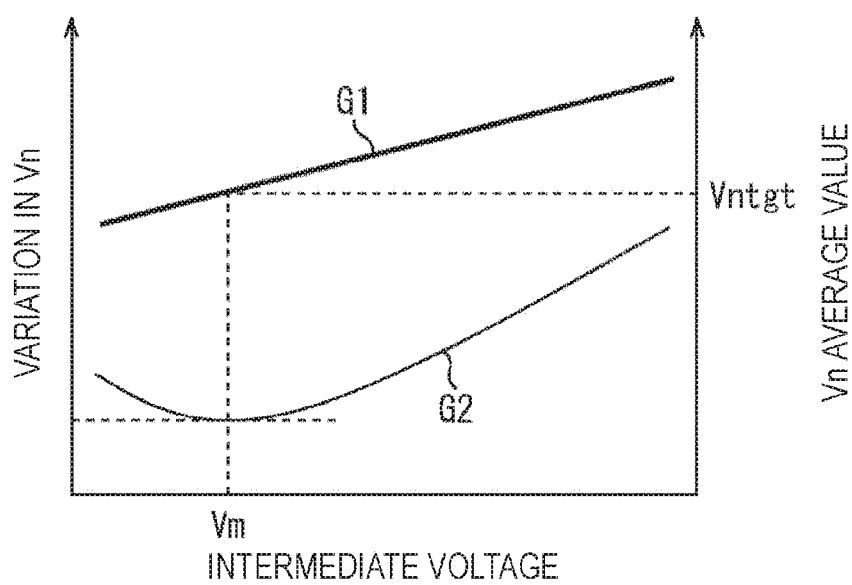
FIG. 10 is a diagram to describe an exemplary method of determining an intermediate voltage.

FIG. 10 is a graph of a relation between the intermediate voltage Vm and the variation and an average value of the noise signal Vn. The horizontal axis of the graph indicates the intermediate voltage Vm, and the vertical axis indicates the variation and the average value of the noise signal Vn. Furthermore, a graph G1 indicates a relation between the intermediate voltage Vm and the average value of the noise signal Vn, and a graph G2 indicates a relation between the intermediate voltage Vm and the variation of the noise signal Vn.

This data is obtained, for example, by repeatedly measuring the noise signals Vn while changing the intermediate voltage Vm. Then, for example, it is preferable to employ a voltage at which the variation of the noise signal Vn is minimized as an actual intermediate voltage Vm.

Figure 11:
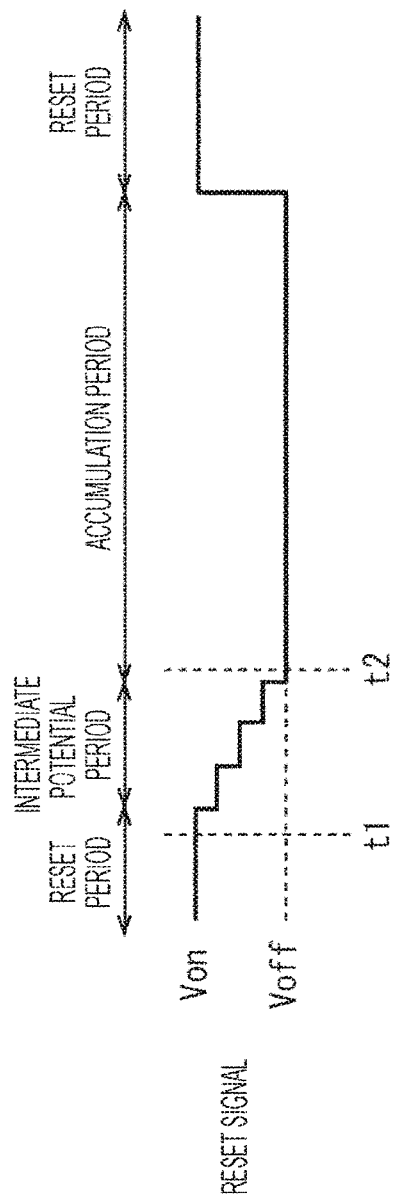
FIG. 11 is a diagram to describe a second example of a control method of a reset signal at the time of the reset off.

Furthermore, for example, as illustrated in FIG. 11, it is possible to set the intermediate voltage Vm to a plurality of levels having two or more stages in the intermediate potential period and approximate the reset signal from the on voltage Von to the off voltage Voff in stages. In this way, by setting the intermediate voltage Vm at the levels of two or more stages, it can be expected that the amount of the charges in the channel unit immediately before the reset transistor 203 is turned off is more reduced and the variation in the amount of the charges for moving to the charge holding unit 202 can be further reduced.

Figure 12:
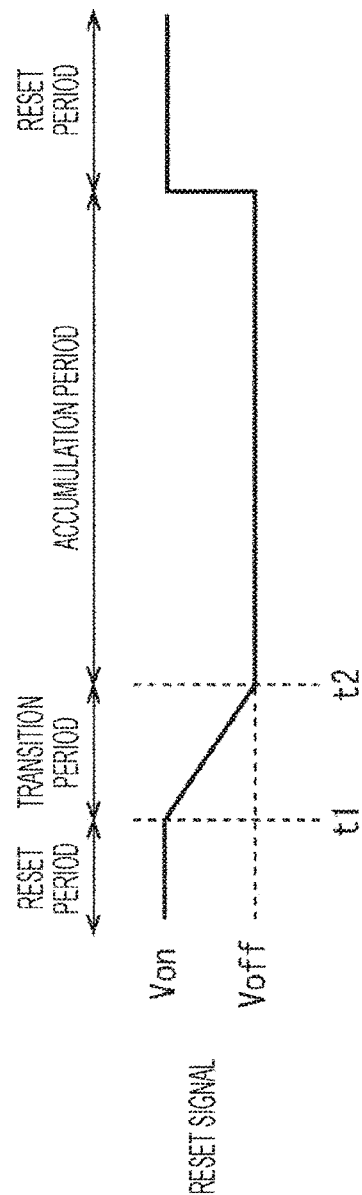
FIG. 12 is a diagram to describe a third example of a control method of a reset signal at the time of the reset off.

Furthermore, for example, as illustrated in FIG. 12, an inclination of fall of the reset signal may be reduced in a transition period between the reset period and the accumulation period. That is, the reset signal may be moderately changed from the on voltage Von to the off voltage Voff. With this structure, it can be expected that the amount of the charges accumulated in the channel unit immediately before the reset transistor 203 is turned off is more reduced and the variation in the amount of the charges for moving to the charge holding unit 202 is further reduced, in comparison with a case where the reset voltage is set to the intermediate voltage Vm. Furthermore, it is not necessary to optimize the intermediate voltage Vm by experiment and the like.

Furthermore, in an example in FIG. 12, to minimize a decrease of a frame rate, it is desirable that an inclination of rise be maintained to be steep in a case where the reset signal is switched from the off voltage Voff to the on voltage Von at the time of the read operation. That is, it is desirable that the transition time at the time when the reset signal is switched from the on voltage Von to the off voltage Voff at the time of the shutter operation is lengthened while maintaining the transition time at the time when the reset signal is switched from the off voltage Voff to the on voltage Von at the time of the read operation to be short. Therefore, the transition time of the latter is longer than the transition time of the former.

Furthermore, in the example in FIG. 7, after the R-phase signal in the read row is read, the reset signal is switched to L, and the reset transistor 203 is turned off. However, the reset transistor 203 may be kept to be turned on until the reading of the shutter row starts. Furthermore, in this case, the R-phase signals in the shutter row and the read row can be read in common.

Note that, in the above, the configuration of the unit pixel, the arrangement of the unit pixels, the pixel structure, and the like have been described with reference to FIGS. 2 to 4 and the like. However, the present technology can be applied to a signal processing apparatus which has an arbitrary configuration and structure and processes signals read from unit pixels arranged in an arbitrary pattern. That is, the present technology can be applied to an imaging element which has an arbitrary configuration and structure and has unit pixels arranged in an arbitrary pattern. Therefore, the configuration of the unit pixel, the arrangement of the unit pixels, the pixel structure, and the like to which the present technology is applied are not limited to those in the above examples (examples in FIGS. 2 to 4).

However, as described above, it is more difficult to sufficiently reduce the kTC noise particularly in a case where the unit pixel which cannot be completely depleted is used. However, even in this case, by applying the present technology, the kTC noise included in the pixel signal can be sufficiently reduced. Therefore, in this case, by applying the present technology, the imaging element can prevent the deterioration in the image quality of the image of the image data and obtain a larger effect.

2. Second Embodiment

Meanwhile, in the reading control processing according to the first embodiment (FIGS. 6 and 7), the correlated double sampling is performed on a voltage fluctuation caused by Feed Through (FT) to extract the kTC noise. Therefore, it is necessary to read a change of the feed through at the time of reading. Therefore, a voltage of a Data phase (D phase) is higher than a voltage of a Reset phase (R phase) by an amount of the feed through. When a traditional A/D converter is used, a phenomenon may occur such that the reference signal having a ramp waveform (ramp signal) deviates from the signal read from the unit pixel 200 and A/D conversion cannot be normally performed.

To avoid this phenomenon, it is necessary to prepare A/D converters for each of colors of green, red, and blue or mount clamp circuits to two lines of pixels of an organic photoelectric conversion film and pixels of a photodiode. In a case where such a configuration is employed, the size of the circuit is increased, and control of the circuit becomes complicated. Therefore, an A/D converter is required that can avoid an influence of the voltage fluctuation caused by the feed through while preventing the increase in the circuit size and the complication of the control.

Although the description of the detailed content has been omitted above, to satisfy such a requirement, in the reading control processing (FIGS. 6 and 7) according to the first embodiment, the A/D conversion performed by comparing the signal read from the unit pixel 200 via the vertical signal line 113 with the ramp signal is normally performed by the A/D conversion unit 103 by preventing the increase in the circuit size and the complication of the control and reducing the influence of the voltage fluctuation caused by the feed through.

Therefore, more detailed contents of the reading control processing according to the first embodiment (FIGS. 6 and 7) will be described below as the second embodiment.

<Imaging Element>

Figure 13:
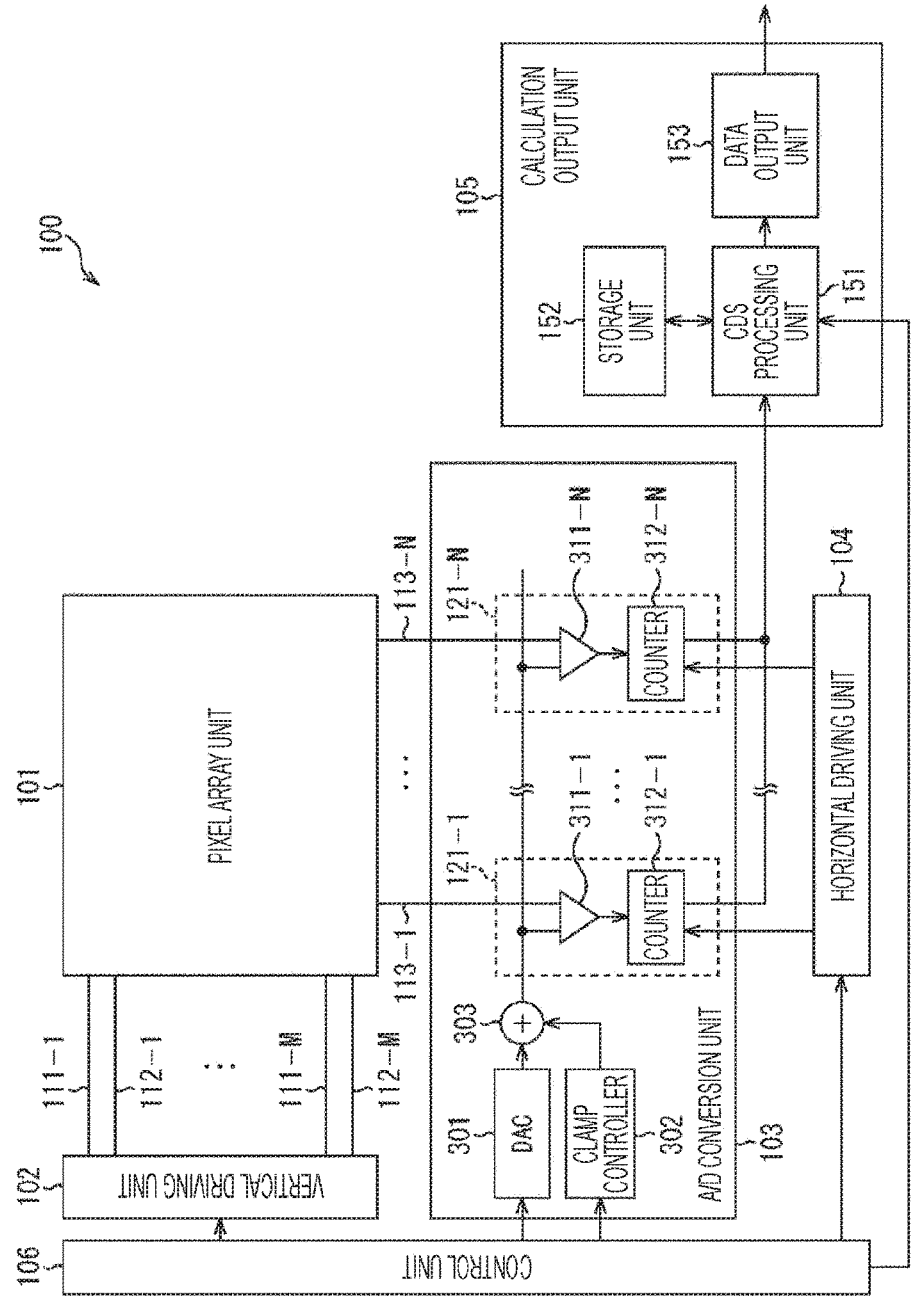
FIG. 13 is a diagram of a detailed configuration example of the first embodiment of the imaging element.

FIG. 13 is a diagram of a main configuration example of an imaging element to which the present technology has been applied. An imaging element 100 illustrated in FIG. 13 is a CMOS image sensor and the like. Components corresponding to those of the imaging element 100 illustrated in FIG. 1 are denoted with the same reference numerals, and the description thereof will be appropriately omitted. That is, in the imaging element 100 illustrated in FIG. 13, a more detailed configuration of an A/D conversion unit 103 is illustrated.

The A/D conversion unit 103 performs A/D conversion on analog signals read from unit pixels 200 arranged in a pixel array unit 101 in a matrix. The A/D conversion unit 103 includes ADCs 121-1 to 121-N (N is arbitrary natural number), a Digital Analog Converter (DAC) 301, a clamp controller 302, and an adder 303.

The DAC 301 generates a signal having a ramp waveform and supplies the signal to the adder 303 as an output signal on the basis of control of a control unit 106. The clamp controller 302 generates an output signal for DC level control and supplies the signal to the adder 303 on the basis of the control of the control unit 106. The adder 303 adds the output signal from the DAC 301 and the output signal from the clamp controller 302 and supplies the added signal to the ADCs 121-1 to 121-N as a reference signal having a ramp waveform (ramp signal).

In the ADC 121-1, a comparator 311-1 compares a voltage level of an analog signal (pixel signal) read from the unit pixel 200 in a first column via a vertical signal line 113-1 with a voltage level of a ramp signal which rises or falls with a predetermined inclination from the adder 303. At this time, in a counter 312-1, a counter latch is operated. Then, in the ADC 121-1, the ramp signal from the adder 303 and a counter value of a counter 312-1 change as having one-to-one correspondence. With this change, the analog signal (pixel signal) input via the vertical signal line 113-1 is converted into digital data.

That is, the ADC 121-1 converts the change in the voltage level of the ramp signal into the change in time and converts the time into a digital value by counting the time at a certain cycle (clock). Here, when the analog signal (pixel signal) input via the vertical signal line 113-1 intersects with the ramp signal from the adder 303, an output of the comparator 311-1 is inverted, and an input clock of the counter 312-1 is stopped. Then, the A/D conversion is completed.

In ADC 121-2 to the ADC 121-N, similarly to the ADC 121-1, comparators 311-2 to 311-N compare analog signals (pixel signal) input via respective vertical signal lines 113-2 to 113-N with the ramp signal from the adder 303 and counters 312-2 to 312-N perform a counter latch operation so as to perform the A/D conversion.

Here, the clamp controller 302 generates an output signal for DC level control on the basis of a clamp signal (CLPEN) from the control unit 106 and supplies the output signal to the adder 303. That is, the clamp controller 302 generates the output signal for DC level control as a shutter operation in a state where the reset signal of the unit pixel 200 is High and as a read operation in a state where the reset signal of the unit pixel 200 is High. Then, the adder 303 adds the output signal from the DAC 301 and the output signal from the clamp controller 302 to obtain a reference signal (ramp signal) having a ramp waveform.

The ramp signal has a larger dynamic range than that in a case of not being clamped. Therefore, in a state where the reset signal is High, that is, at the timing of the R phase in which an influence of the voltage fluctuation caused by the feed through occurs, the control is performed to clamp the ramp signal, and the dynamic range of the ramp signal is enlarged. Accordingly, the deviation of the analog signal (pixel signal) read from the unit pixel 200 via the vertical signal line 113 from the ramp signal is prevented, and the A/D conversion can be normally performed.

Note that the clamp controller 302 includes a resister which can set an adjustment value (clamp code) of a clamp amount. The control unit 106 supplies the clamp signal (CLPEN) to the clamp controller 302 and individually sets the adjustment values of the clamp amount for each of colors including green, red, and blue, to the resister, at a timing of each of the shutter row and the read row. The clamp controller 302 can clamp the ramp signal by performing clamp control at the timing of each color on the bases of the adjustment value of the clamp amount set to the resister. As a result, the reading control processing can be accurately performed without adding a new circuit, such as, preparing an A/D converter for each color and mounting two lines of clamp circuits <Reading Control Processing>

In the imaging element 100 (FIG. 13) having the above configuration, when the signal is read from the unit pixel 200, the control unit 106 controls each unit by performing reading control processing as follows and reads the signal from each unit pixel 200. Next, an exemplary flow of the reading control processing will be described with reference to the flowchart in FIG. 14. This will be described with reference to FIG. 15 as necessary.

Figure 6:
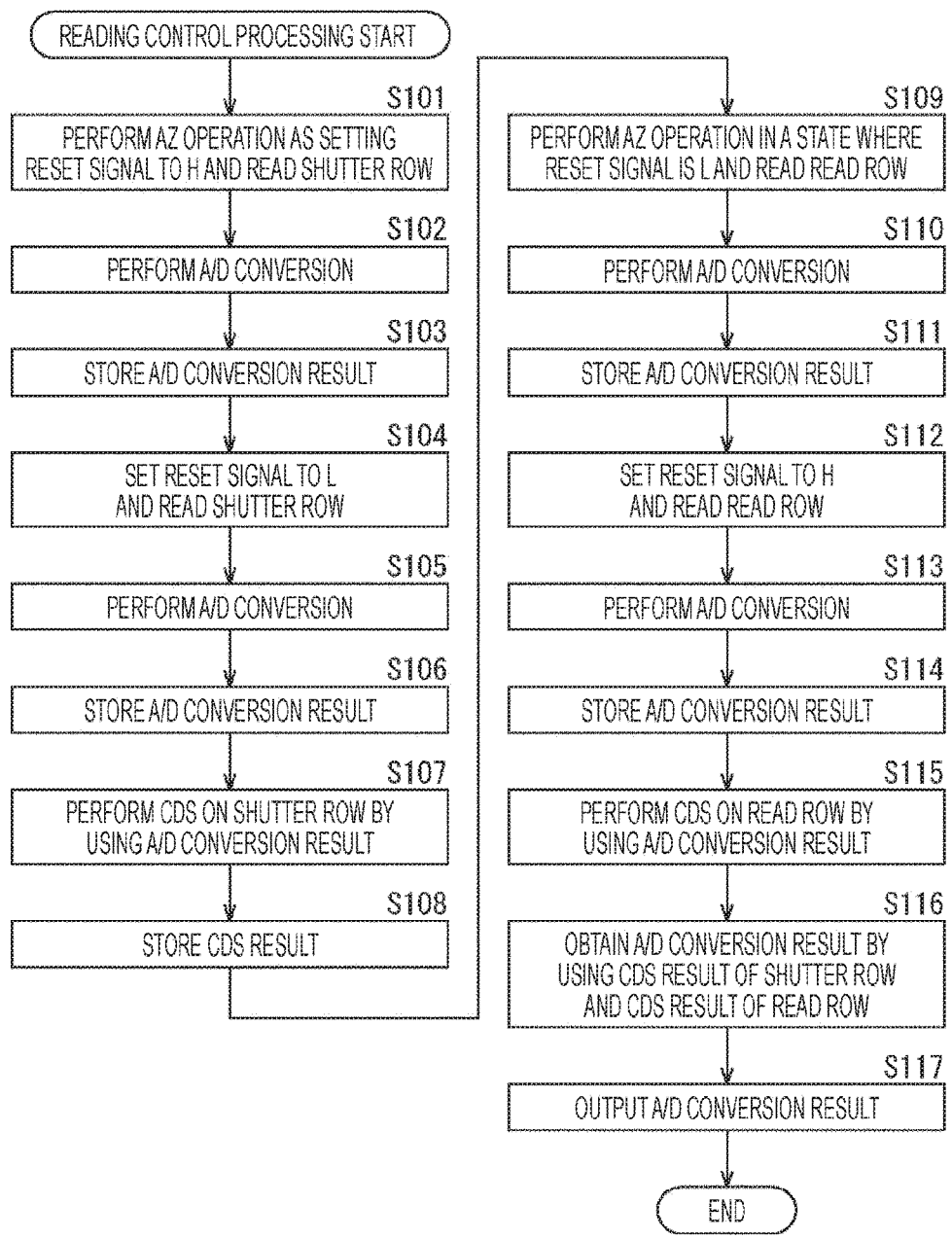
FIG. 6 is a flowchart to describe an exemplary flow of reading control processing.

When the reading control processing is started, in steps S201 to S204, similarly to steps S101 to S103 in FIG. 6, as a shutter operation, a vertical driving unit 102 is controlled to set a reset signal to High (H), and each unit of the unit pixel 200 in a shutter row performs an AZ operation in a state where the reset signal is H to read signals. Then, an A/D conversion unit 103 performs A/D conversion on the signal read from the unit pixel 200 in each column by the processing in step S201. Since the A/D conversion is performed in a state where the reset signal is High, that is, at a R-phase timing when an influence of a voltage fluctuation caused by a feed through occurs, a clamp controller 302 performs clamp control (S202), and an output signal from a DAC 301 is clamped.

Figure 15:
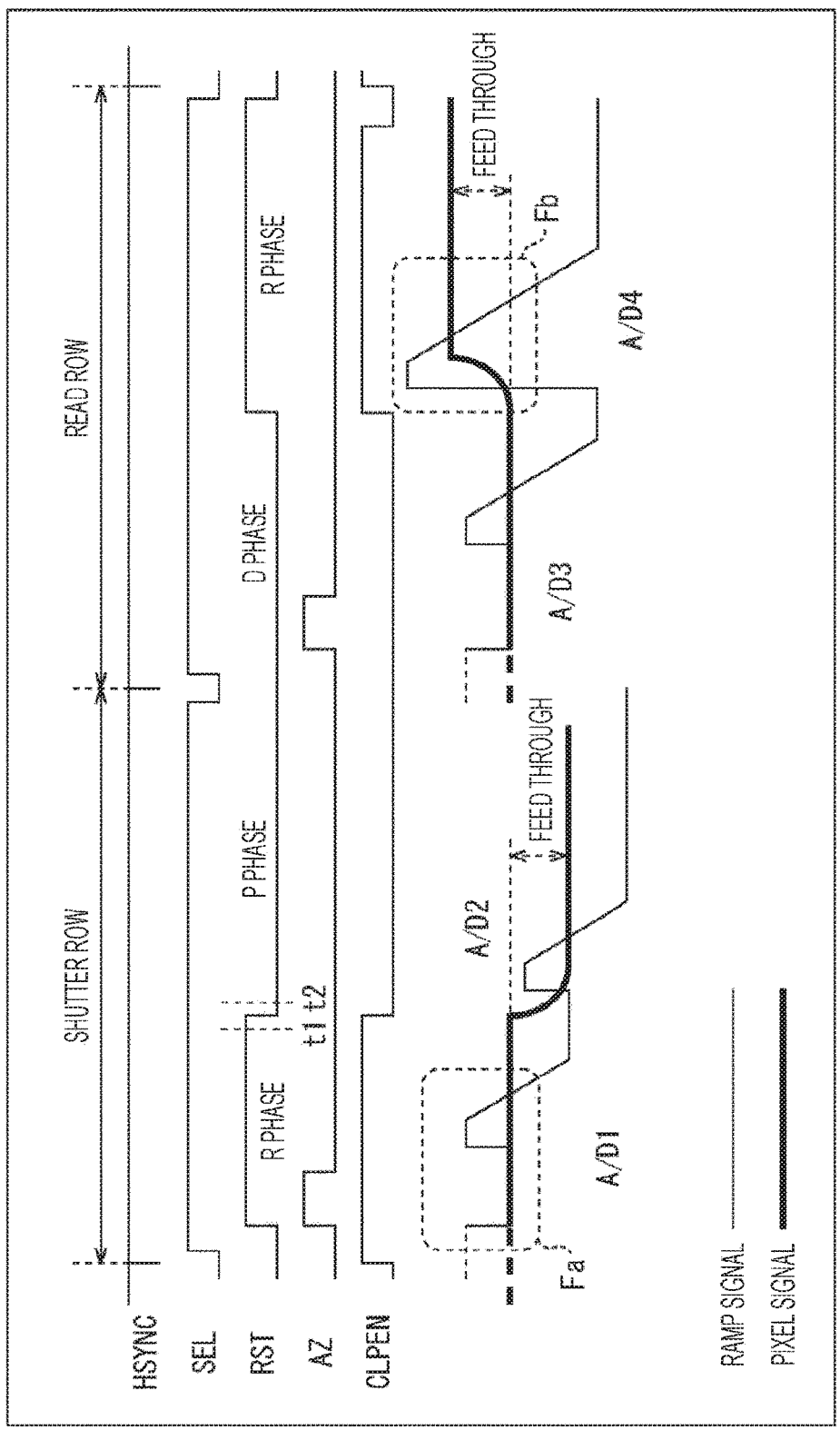
FIG. 15 is a timing chart to describe an exemplary drive state at the time of the pixel reading.

As a result, as illustrated in a frame Fa in FIG. 15, a dynamic range of a ramp signal from an adder 303 is enlarged, and the A/D conversion can be normally performed without deviating the signal read from the unit pixel 200 in each column from the ramp signal (S203). With this processing, an A/D conversion result of the portion (R phase) of "A/D1" in FIG. 15 is obtained. Then, digital data of the A/D conversion result obtained by the processing in step S203 is stored in a storage unit 152 (S204).

In steps S205 to S207, similarly to steps S104 to S106 in FIG. 6, as the shutter operation, the vertical driving unit 102 is controlled to set the reset signal to Low (L), and each unit of the unit pixels 200 in the shutter row reads signals in a state where the reset signal is L. Then, the A/D conversion unit 103 performs A/D conversion on the signal read from the unit pixel 200 in each column by the processing in step S205.

With this processing, an A/D conversion result of the portion (P phase) of "A/D2" in FIG. 15 is obtained. Then, digital data of the A/D conversion result obtained by the processing in step S206 is stored in a storage unit 152 (S207).

In steps S208 and S209, similarly to steps S107 and 108 in FIG. 6, a CDS processing unit 151 reads the digital data of the A/D conversion result stored in the storage unit 152 in steps S204 and S207 and performs correlated double sampling on the shutter row by using the digital data. With this processing, an A/D conversion result (noise signal Vn) corresponding to a kTC noise and a feed through voltage is obtained. Then, the CDS result obtained by the processing in step S208 is stored in the storage unit 152 (S209).

Next, in steps S210 to S212, similarly to steps S109 to S111 in FIG. 6, as a read operation, each unit of the unit pixel 200 in a read row performs an AZ operation in a state where the reset signal is L and reads a signal. Then, the A/D conversion unit 103 performs A/D conversion on the signal read from the unit pixel 200 in each column by the processing in step S210.

With this processing, an A/D conversion result of the portion (D phase) of "A/D3" in FIG. 15 is obtained. Then, digital data of the A/D conversion result obtained by the processing in step S211 is stored in a storage unit 152 (S212).

In steps S213 to S216, similarly to steps S112 to S114 in FIG. 6, as the read operation, the vertical driving unit 102 is controlled to set the reset signal to H, and each unit of the unit pixels 200 in the read row reads signals in a state where the reset signal is H. Then, the A/D conversion unit 103 performs A/D conversion on the signal read from the unit pixel 200 in each column by the processing in step S213. Since the A/D conversion is performed in a state where the reset signal is High, that is, at the R-phase timing when the influence of the voltage fluctuation caused by the feed through occurs, the clamp controller 302 performs the clamp control (S214), and the output signal from the DAC 301 is clamped.

As a result, as illustrated in a frame Fb in FIG. 15, a dynamic range of a ramp signal from an adder 303 is enlarged, and the A/D conversion can be normally performed without deviating the signal read from the unit pixel 200 in each column from the ramp signal (S215). With this processing, an A/D conversion result of the portion (R phase) of "A/D4" in FIG. 15 is obtained. Then, digital data of the A/D conversion result obtained by the processing in step S215 is stored in a storage unit 152 (S216).

In step S217, similarly to step S115 in FIG. 6, the CDS processing unit 151 reads the digital data of the A/D conversion result stored in the storage unit 152 in steps S212 and S216 and performs the correlated double sampling on the read row by using the digital data. With this processing, an A/D conversion result (data signal Vd) corresponding to the kTC noise, the feed through voltage, and an amount of the charges which have been photoelectrically converted according to a predetermined accumulation time is obtained.

In steps S218 and 219, similarly to steps S116 and 117 in FIG. 6, the CDS processing unit 151 reads the CDS result (that is, A/D conversion result (noise signal Vn) corresponding to kTC noise and feed through voltage) stored in the storage unit 152 in step S209 from the storage unit 152 and performs the correlated double sampling by using the CDS result and the CDS result obtained by the processing in step S217 (that is, A/D conversion result (data signal Vd) corresponding to kTC noise, feed through voltage, and amount of charges which have been photoelectrically converted according to predetermined accumulation time).

For example, the CDS processing unit 151 subtracts the noise signal Vn from the data signal Vd. By this processing, an A/D conversion result (output signal Vout) corresponding to the amount of the charges, which are photoelectrically converted according to the predetermined accumulation time, with sufficiently reduced kTC noise is obtained. The output signal Vout obtained in step S218 is supplied to a data output unit 153 and is output to the outside of the imaging element 100 (S219).

Figure 14:
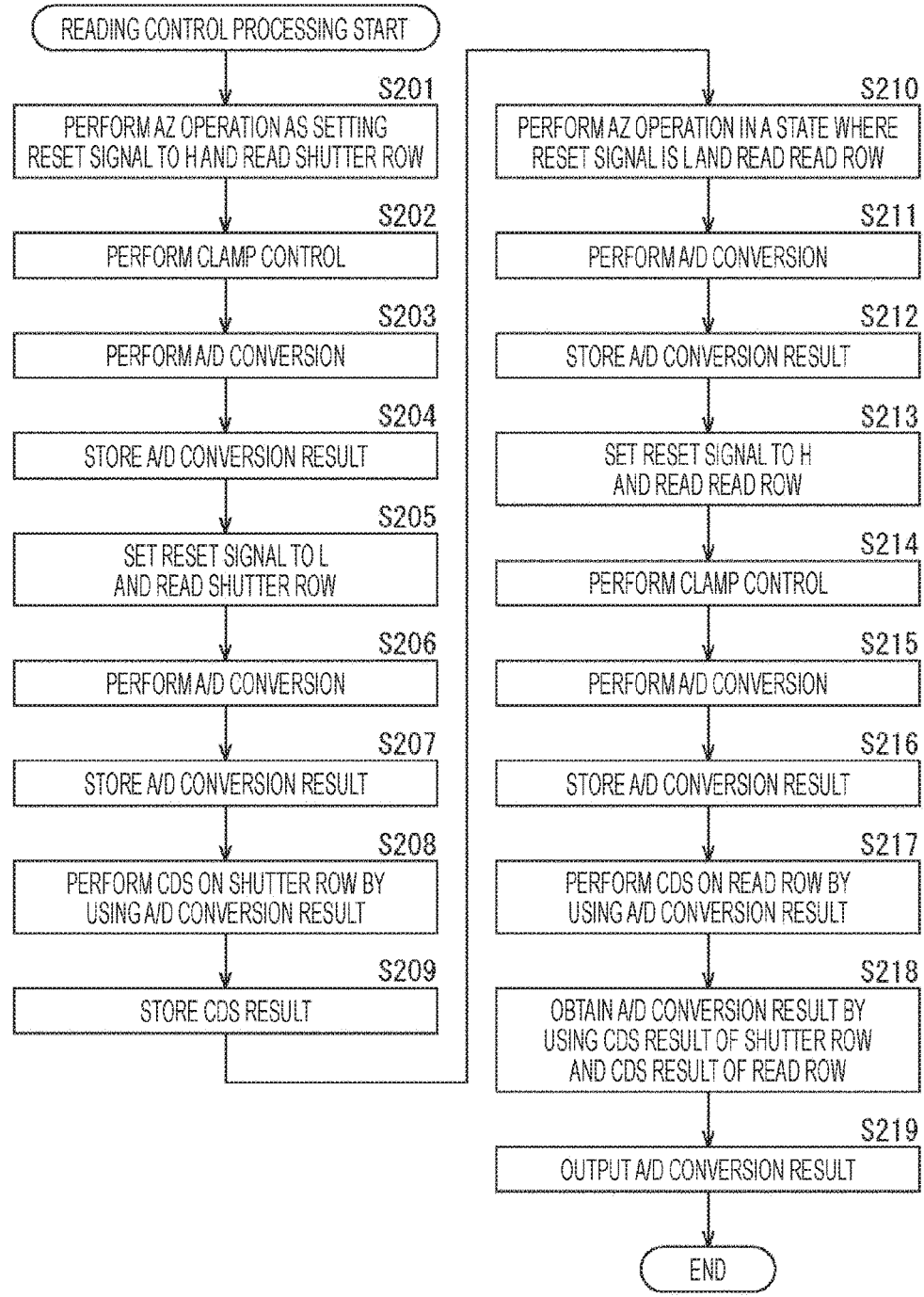
FIG. 14 is a flowchart to describe an exemplary flow of the reading control processing.

When the processing in step S219 is completed, the reading control processing in FIG. 14 is completed.

By performing the above reading control processing, the imaging element 100 (CDS processing unit 151) can output the A/D conversion result (output signal Vout) corresponding to the amount of the charges, which are photoelectrically converted according to the predetermined accumulation time, with the sufficiently reduced kTC noise to the outside as imaged image data. Therefore, the imaging element 100 can prevent deterioration in image quality of imaged image due to the kTC noise and the like.

Furthermore, control is performed to clamp the ramp signal as the shutter operation in a state where the reset signal of the unit pixel 200 is High and as the read operation in a state where the reset signal of the unit pixel 200 is High, that is, a R-phase timing when the influence of the voltage fluctuation caused by the feed through occurs, and accordingly, the dynamic range (amplitude) of the ramp signal is enlarged. With this structure, deviation of the analog signal (pixel signal) read from the unit pixel 200 via the vertical signal line 113 from the ramp signal can be prevented, and the A/D conversion can be normally performed.

Furthermore, as described above, in the clamp controller 302, the resister is provided which can independently set the adjustment value of the clamp amount at each of timings of the shutter row and the read row for each of the colors of green, red, and blue (for example, timings of "A/D1" and "A/D3" in FIG. 15). Therefore, the clamp controller 302 can clamp the ramp signal by performing the clamp control at an arbitrary timing for each color on the basis of the adjustment value of the clamp amount set to the resister.

As a result, for example, the clamp control can be performed at an arbitrary timing for each color without preparing the A/D converter for the colors of green, red, and blue, and mounting the clamp circuits. Furthermore, for example, the clamp control can be performed on pixels having different characteristics without mounting clamp circuits to two lines of pixels of an organic photoelectric conversion film and pixels of a photodiode.

In this way, by providing the resister capable of setting the adjustment value of the clamp amount in the clamp controller 302, it is not necessary to prepare the A/D converter for each color and mount the clamp circuit or to mount the clamp circuits to the two lines of pixels of the organic photoelectric conversion film and the photodiode. Therefore, increase in the size of the circuit can be reduced, and complication of the control can be avoided.

Furthermore, in the example in FIG. 715, after the R-phase signal in the read row is read, the reset signal is switched to L, and the reset transistor 203 is turned off. However, the reset transistor 203 may be kept to be turned on until the reading of the shutter row starts. Furthermore, in this case, the R-phase signals in the shutter row and the read row can be read in common.

3. Third Embodiment

Next, a third embodiment according to the present technology will be described with reference to FIG. 16.

<Imaging Element>

Figure 16:
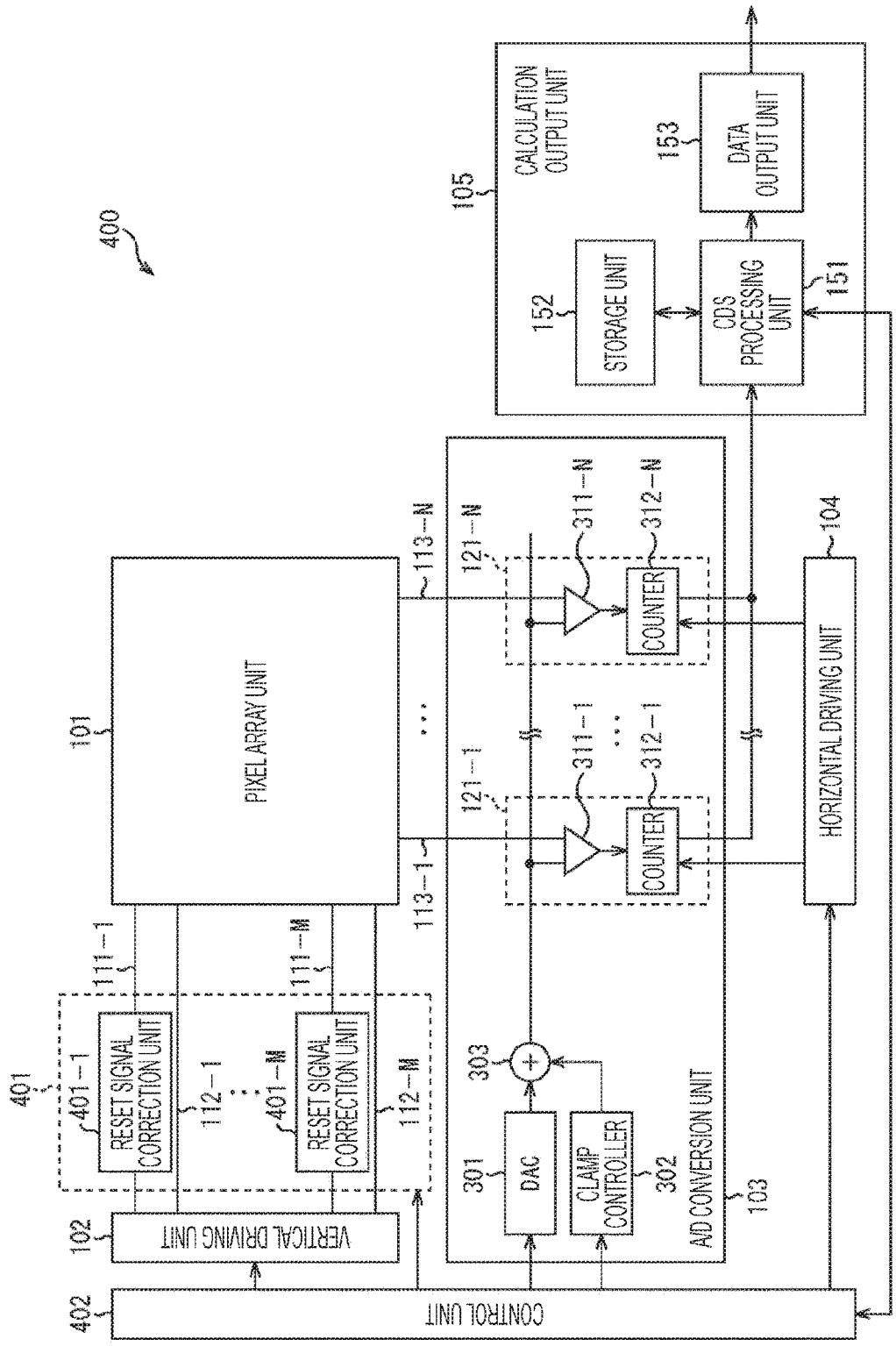
FIG. 16 is a diagram of a detailed configuration example of a second embodiment of an imaging element.

FIG. 16 is a diagram of a main configuration example of an imaging element 400 according to a third embodiment of the present technology. Note that, in FIG. 16, the components corresponding to those in FIG. 13 are denoted with the same reference numerals, and description of the parts of the same processing will be appropriately omitted.

The imaging element 400 is different from the imaging element 100 in FIG. 13 in that a reset signal correction unit 401 is added and a control unit 402 is provided instead of the control unit 106.

The reset signal correction unit 401 includes reset signal correction units 401-1 to 401-M for respective reset lines 111. On the basis of control of the control unit 402, each of the reset signal correction units 401-1 to 401-M corrects a waveform (voltage) of a reset signal supplied from a vertical driving unit 102 and supplies the reset signal to each pixel of a pixel array unit 101.

In addition to the function of the control unit 106 of the imaging element 100 in FIG. 13, the control unit 402 has a function for controlling the reset signal correction units 401-1 to 401-M. For example, the control unit 402 controls an intermediate voltage Vm of the reset signal via each of the reset signal correction units 401-1 to 401-M on the basis of the signal (for example, noise signal Vn) supplied from a CDS processing unit 151 so as to reduce variation in a potential of a charge holding unit 202 at the time of reset off.

For example, on the basis of data of correlation between the intermediate voltage Vm and the noise signal Vn in FIG. 10 described above, the control unit 402 stores an average voltage Vntgt of the noise signal Vn, with which variation of the noise signal Vn is minimized, in advance. Then, the control unit 402 controls the reset signal correction units 401-1 to 401-M and controls the reset signal so that an average value of the noise signal Vn approximates the average voltage Vntgt as possible. With this control, for example, even in a case where a threshold voltage Vth of the reset transistor 203 is different from a designed value due to manufacturing variations and the like, variation in the potential of the charge holding unit 202 at the time of the reset off can be reduced.

Furthermore, for example, it is preferable that the control unit 402 control whether to provide the intermediate potential period in FIG. 9 or FIG. 11 described above on the basis of the result of comparison with a D-phase pixel signal VRlow at the time of a reading operation of the noise signal Vn. For example, in a case where the noise signal Vn is sufficiently smaller than the pixel signal VRlow (for example, in a case where noise signal Vn is equal to or less than 10% of pixel signal VRlow), in other words, in a case where a kTC noise is sufficiently smaller than a signal component corresponding to the amount of the charges accumulated in the accumulation period, the control unit 402 may directly switch the reset signal from an on voltage Von to an off voltage Voff without providing the intermediate potential period as illustrated in FIG. 8. With this processing, a frame rate can be increased by an amount of omission of the intermediate potential period at the time of high illuminance at which the pixel signal VRlow becomes large.

Similarly, for example, the control unit 402 may control the length of the transition period in FIG. 12 described above on the basis of the result of the comparison between the noise signal Vn and the pixel signal VRlow. For example, in a case where the noise signal Vn is sufficiently smaller than the pixel signal VRlow (for example, in a case where noise signal Vn is equal to or less than 10% of pixel signal VRlow), the control unit 402 may directly switch the reset signal from the on voltage Von to the off voltage Voff by setting the transition period to zero (that is, omit transition period) as illustrated in FIG. 8. Alternatively, for example, in a case where the noise signal Vn is sufficiently smaller than the pixel signal VRlow (for example, in a case where noise signal Vn is equal to or less than 10% of pixel signal VRlow), the control unit 402 may shorten the transition period and makes fall of the reset signal be steep. With this processing, a frame rate can be increased by an amount of the reduction in the transition period at the time of the high illuminance at which the pixel signal VRlow becomes large.

Note that, for example, the control unit 402 may compare the data signal Vd with the noise signal Vn instead of the pixel signal VRlow.

4. Fourth Embodiment

Next, a fourth embodiment according to the present technology will be described with reference to FIGS. 17 to 19.

Figure 17:
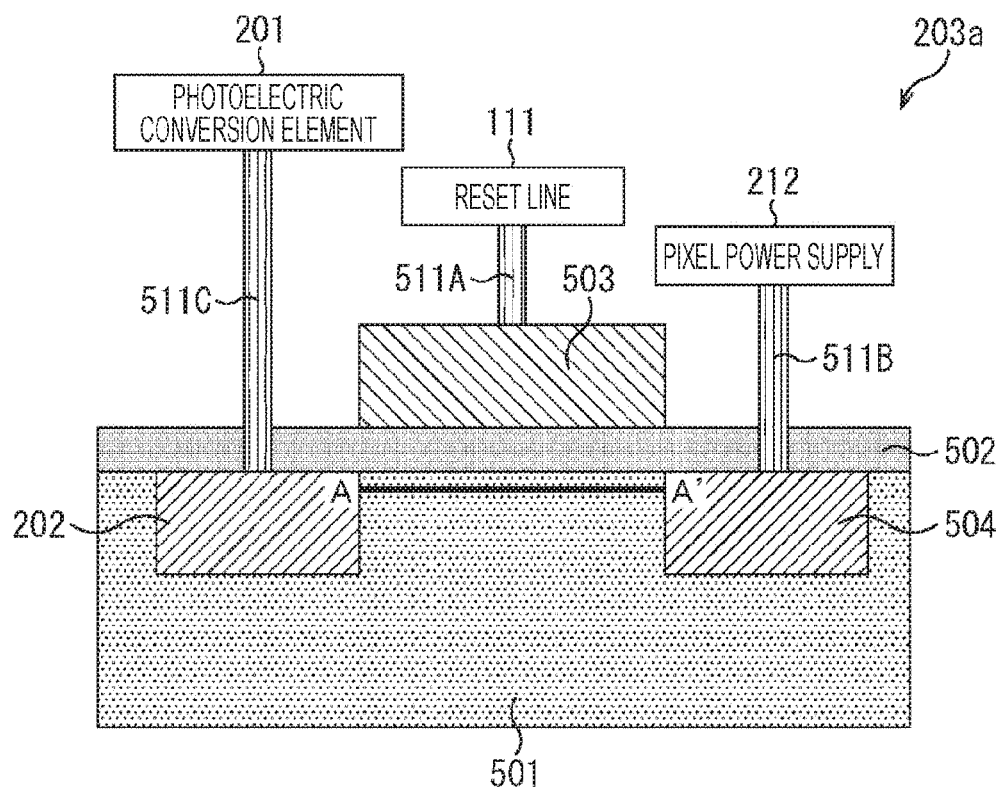
FIG. 17 is a schematic diagram of a cross section of a first embodiment of a reset transistor.

FIG. 17 schematically illustrates a cross section of a reset transistor 203a which is the first embodiment of the reset transistor 203.

In the reset transistor 203a, an insulation film 502 is formed on a semiconductor substrate 501, and a gate electrode 503 is formed on the insulation film 502. The gate electrode 503 is connected to a reset line 111 via a wiring 511A.

Furthermore, on the surface of the semiconductor substrate 501, a drain diffusion layer 504 and a charge holding unit 202 are formed so as to sandwich the gate electrode 503 therebetween. The drain diffusion layer 504 is connected to a pixel power supply 212 via a wiring 511B. The charge holding unit 202 is connected to a photoelectric conversion element 201 via a wiring 511C.

Figure 18:
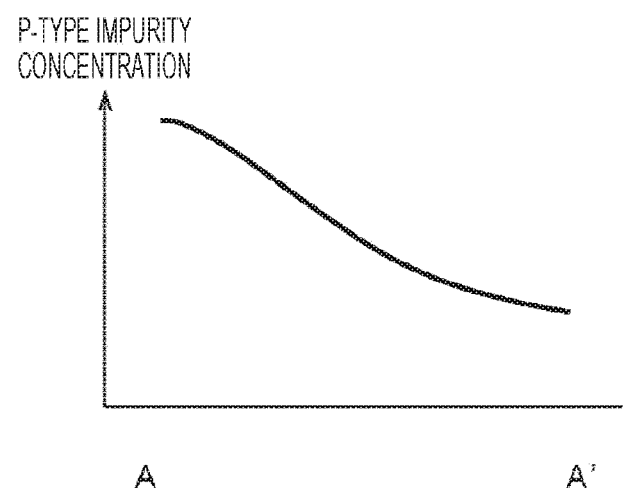
FIG. 18 is a graph of an exemplary P-type impurity concentration distribution along a cross section of the reset transistor taking along an A-A' line in FIG. 17.

FIG. 18 illustrates an exemplary P-type impurity concentration distribution along an A-A' cross section (channel unit immediately under gate electrode 503 of semiconductor substrate 501 of reset transistor 203a) in FIG. 17. In this example, a P-type impurity concentration increases as being closer to the charge holding unit 202, and the P-type impurity concentration decreases as being closer to the drain diffusion layer 504.

Figure 19:
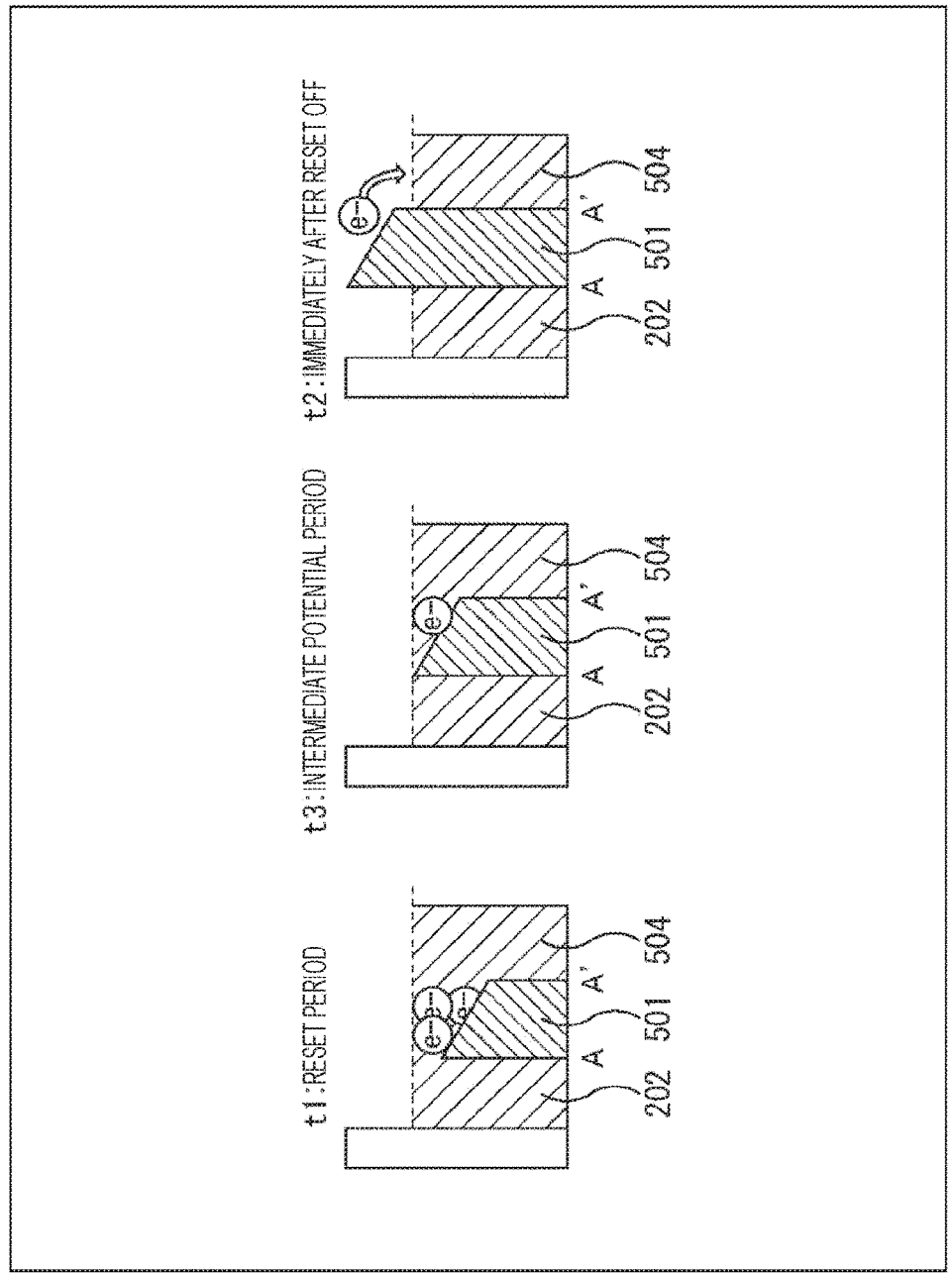
FIG. 19 is a diagram in which a potential distribution at the time of the reset off of the reset transistor in FIG. 17 is schematically illustrated.

FIG. 19 schematically illustrates a potential distribution of the charge holding unit 202, the channel unit of the semiconductor substrate 501 of the reset transistor 203a, and the drain diffusion layer 504 at times t1, t3, and t2. Note that the times t1, t3, and t2 are respectively the same as the times t1, t3, and t2 in FIG. 9.

By increasing the P-type impurity concentration of the channel unit of the reset transistor 203a on the side of the charge holding unit 202 as illustrated in FIG. 18, a potential gradient is formed to prevent the movement of the charges accumulated in the channel unit to the charge holding unit 202 as illustrated in FIG. 19. Therefore, it is possible to further reduce the variation in the potential of the charge holding unit 202 immediately after the reset off.

5. Fifth Embodiment

Next, a fifth embodiment according to the present technology will be described with reference to FIG. 20.

Figure 20:
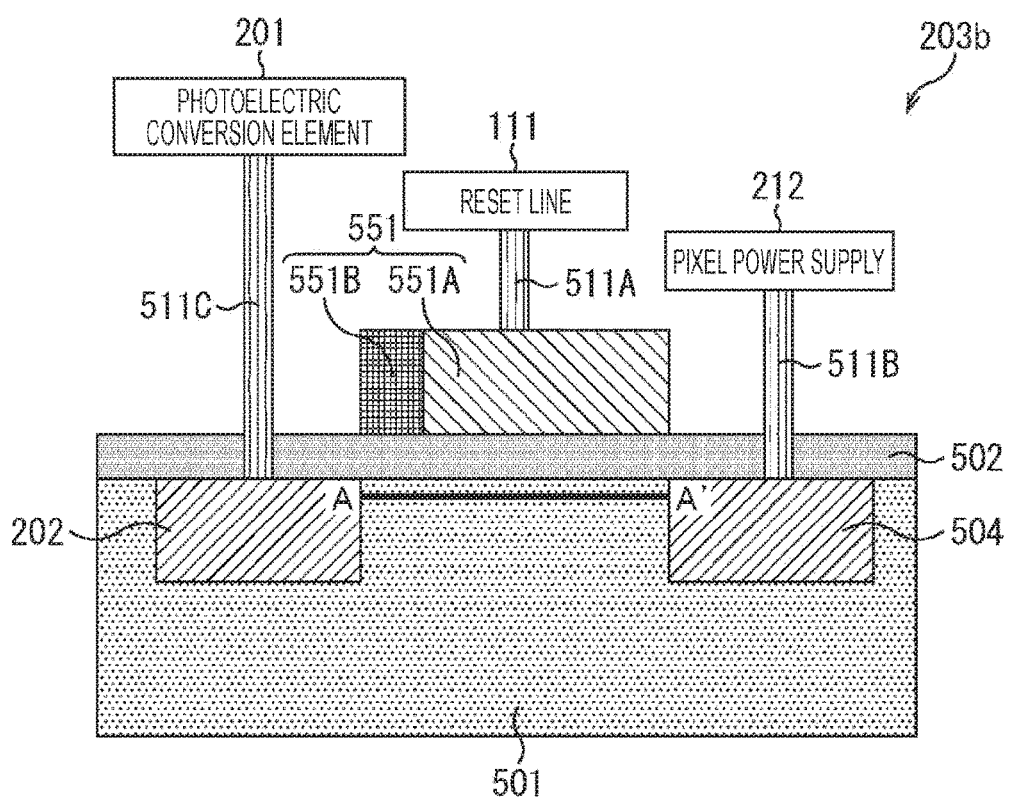
FIG. 20 is a schematic diagram of a cross section of a second embodiment of the reset transistor.

FIG. 20 schematically illustrates a cross section of a reset transistor 203b which is the second embodiment of the reset transistor 203. Note that, in FIG. 20, the components corresponding to those in the reset transistor 203a in FIG. 18 are denoted with the same reference numerals, and the description thereof will be appropriately omitted.

The reset transistor 203b is different from the reset transistor 203b in that a gate electrode 551 is provided instead of the gate electrode 503.

The gate electrode 551 is divided into a gate electrode 551A on a side of a drain diffusion layer 504 and a gate electrode 551B on a side of a charge holding unit 202. A work function of the gate electrode 551B is larger than a work function of the gate electrode 551A. With this configuration, as in FIG. 19 described above, a potential gradient is formed so as to prevent a movement of charges accumulated in a channel unit to the charge holding unit 202 in the channel unit of the reset transistor 203b. With this structure, it is possible to reduce variation in a potential of the charge holding unit 202 immediately after reset off.

Note that the work function of the gate electrode 551 may be changed at three or more stages. In a case where the work function of the gate electrode 551 is changed at three or more stages, it is preferable to increase the work function as being closer to the charge holding unit 202 and decrease the work function as being closer to the drain diffusion layer 504.

6. Sixth Embodiment

Next, a sixth embodiment according to the present technology will be described with reference to FIG. 21.

Figure 21:
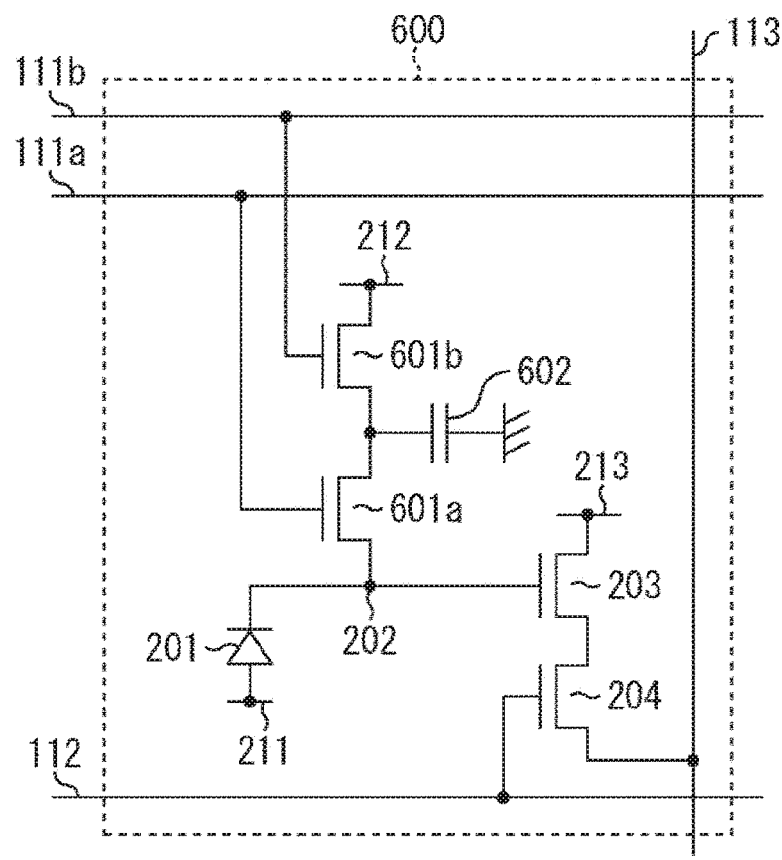
FIG. 21 is a diagram of a main configuration example of a second embodiment of the unit pixel.

FIG. 21 is a diagram of a main configuration example of a unit pixel 600 which can be used instead of the unit pixel 200 in FIG. 2. Note that, in FIG. 21, the components corresponding to those in FIG. 2 are denoted with the same reference numerals, and the description thereof will be omitted.

The unit pixel 600 is different from the unit pixel 200 in that two reset transistors 601a and 601b are provided instead of the reset transistor 203 and a capacitive element 602 is added. Furthermore, the unit pixel 600 is different from the unit pixel 200 in that two reset lines 111a and 111b are arranged from a vertical driving unit 102 (FIG. 1).

In the reset transistor 601a, a drain electrode is connected to a source electrode of the reset transistor 601b, and a source electrode is connected to a charge holding unit 202. Furthermore, a reset signal a is applied to a gate electrode of the reset transistor 601a from the vertical driving unit 102 via the reset line 111a.

In the reset transistor 601b, a drain electrode is connected to a pixel power supply 212 (connection line connected thereto). Furthermore, a reset signal b is applied to a gate electrode of the reset transistor 601b from the vertical driving unit 102 via the reset line 111b.

One end of the capacitive element 602 is connected to the drain electrode of the reset transistor 601a, and the other end is connected to the ground (GND) of a pixel array unit 101.

In the unit pixel 600, for example, by controlling on/off of the reset transistor 601a and changing a capacitance of the charge holding unit 202, a conversion efficiency can be switched.

Furthermore, in the unit pixel 600, for example, by setting the reset signal a to the reset transistor 601a and the reset signal b to the reset transistor 601b to intermediate voltages, variation in a potential of the charge holding unit 202 immediately after the reset off can be reduced. Alternatively, for example, by reducing an inclination of fall of the reset signal a to the reset transistor 601a and the reset signal b to the reset transistor 601b, the variation in the potential of the charge holding unit 202 immediately after the reset off can be reduced.

In addition, in a case where the reset transistor 601a is turned on and the conversion efficiency is decreased, the charge of the pixel signal is accumulated in the channel unit of the reset transistor 601a. Therefore, in this case, it is considered to enhance an effect to reduce generation of dark current shading, a white spot, a black spot, and the like by setting the reset signal a to the intermediate voltage and relaxing an electric field between the channel unit of the reset transistor 601*a* and a well.

Note that three or more reset transistors can be provided for a single unit pixel.

7. Seventh Embodiment

<Imaging Element>

Note that, the imaging element to which the present technology has been applied may have a plurality of semiconductor substrates superposed with each other.

Figure 22:
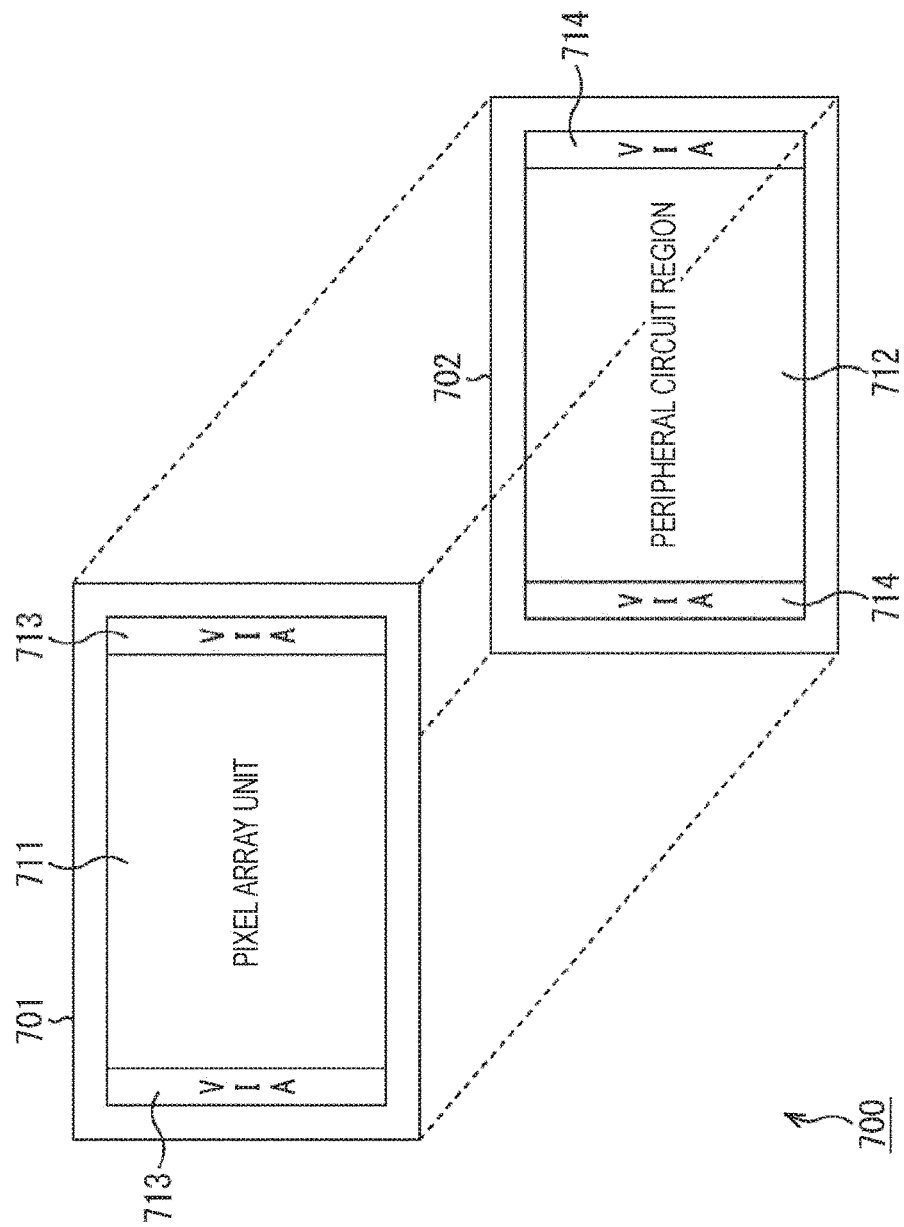
FIG. 22 is a diagram of a main configuration example of a third embodiment of the imaging element.

FIG. 22 is a diagram of a main configuration example of an exemplary imaging element to which the present technology has been applied. An imaging element 700 illustrated in FIG. 22 is an element which images a subject and obtain digital data of the imaged image similarly to the imaging element 100. As illustrated in FIG. 22, the imaging element 700 includes two semiconductor substrates (laminated chip (pixel chip 701 and circuit chip 702)) superposed with each other. Note that, it is preferable to provide a plurality of (layers of) semiconductor substrates (laminated chip). The number of semiconductor substrates may be, for example, equal to or more than three.

In the pixel chip 701, a pixel array unit 711 where a plurality of unit pixels including photoelectric conversion elements for photoelectrically converting incident light are arranged is formed. Furthermore, in the circuit chip 702, a peripheral circuit region 712 where a peripheral circuit for processing a pixel signal read from the pixel array unit 711 is formed is formed.

A circuit configuration of the imaging element 700 is similar to that of the imaging element 100 (FIGS. 1 and 13) or the imaging element (FIG. 16). That is, the pixel array unit 711 is similar to the pixel array unit 101, and a plurality of unit pixels 200 (FIG. 2) or unit pixels 600 (FIG. 21) is formed as in the pixel array unit 101. Furthermore, in the peripheral circuit region 712, a vertical driving unit 102, an A/D conversion unit 103, a horizontal driving unit 104, a calculation output unit 105, a control unit 106, and the like are formed as peripheral circuits.

As described above, the pixel chip 701 and the circuit chip 702 are superposed with each other and form a multilayer structure (laminated structure). Each pixel of the pixel array unit 711 formed in the pixel chip 701 and the peripheral circuits of the peripheral circuit region 712 formed in the circuit chip 702 are electrically connected to each other via through vias (VIA) and the like formed in via regions (VIA) 713 and 714.

As the imaging element 700, the peripheral circuits such as the A/D conversion unit 103 and the calculation output unit 105 to which the present technology has been applied may be formed on a chip different from the pixel array unit 711 (pixel array unit 101). That is, as long as the components can form a substantially similar configuration to the imaging element 100 in FIG. 1 or 13 or the imaging element 400 in FIG. 16, the components can be formed in any way. For example, it is not necessary to integrally form all components of the imaging element 100 or the imaging element 400. That is, for example, a part of or all of the peripheral circuits such as the A/D conversion unit 103 and the calculation output unit 105 may be formed as a LSI different from the pixel array unit 101 (unit pixel 200 or unit pixel 600). In addition, the peripheral circuits may be distributedly formed in a plurality of LSIs.

Note that the embodiments described above can be combined with each other within a possible range. For example, arbitrary two or more of the fourth to sixth embodiments can be combined.

8. Application Example

<Imaging Device>

Figure 23:
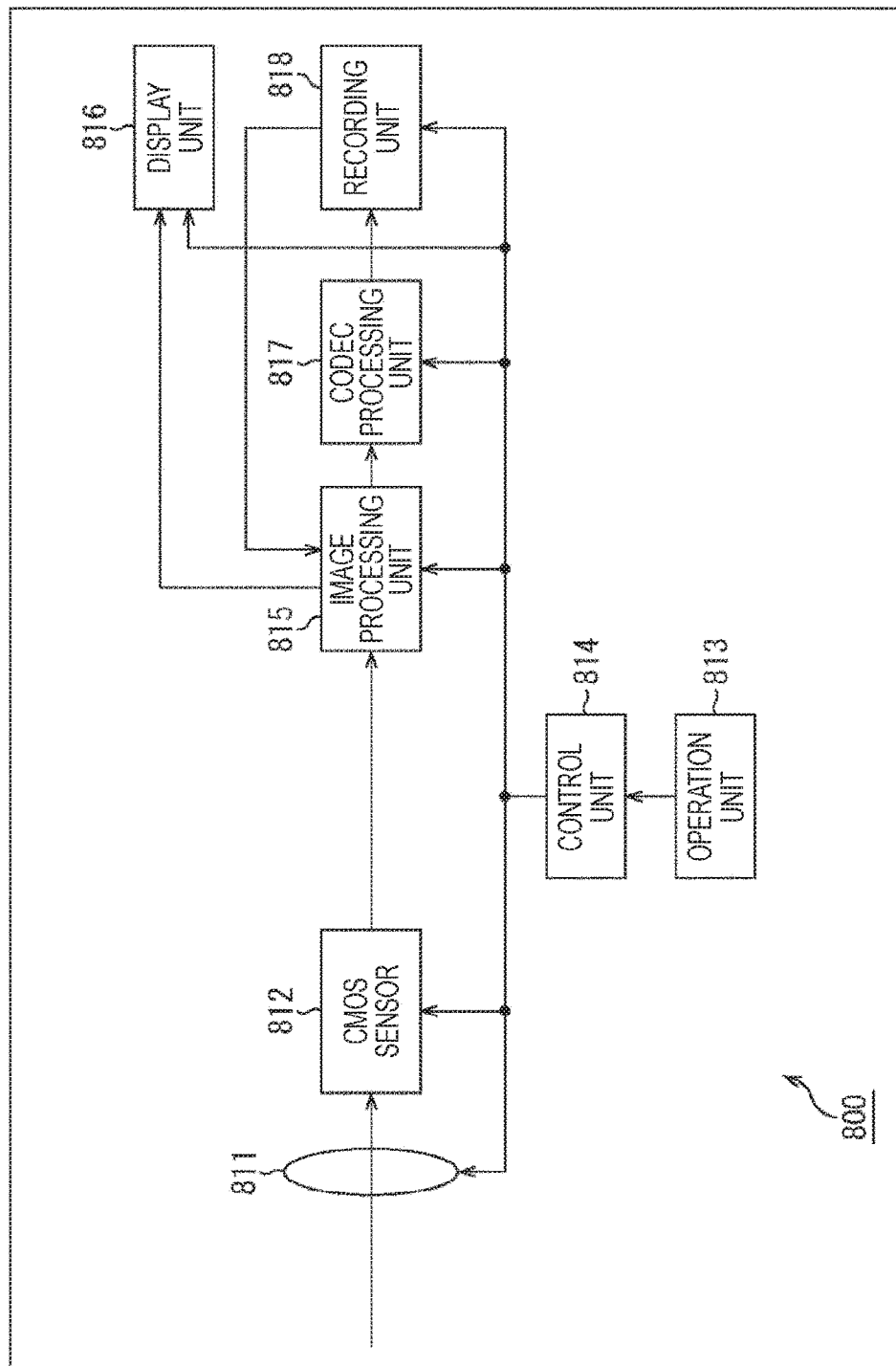
FIG. 23 is a diagram of a main configuration example of an imaging device.

Note that the present technology can be applied to a device other than the imaging element. For example, the present technology may be applied to a device having the imaging element (electronic device and the like) such as an imaging device FIG. 23 is a block diagram of a main configuration example of an imaging device as an exemplary electronic device to which the present technology has been applied. An imaging device 800 illustrated in FIG. 23 is a device for imaging a subject and outputting the image of the subject as an electrical signal.

As illustrated in FIG. 23, the imaging device 800 includes an optical unit 811, a CMOS sensor 812, an operation unit 813, a control unit 814, an image processing unit 815, a display unit 816, a codec processing unit 817, and a recording unit 818.

The optical unit 811 adjusts a focus to the subject and includes a lens which collects light from the position where the focus is adjusted, a diaphragm which adjusts exposure, a shutter which controls a timing of imaging, and the like. The optical unit 811 transmits light from the subject (incident light) and supplies the light to the CMOS sensor 812.

The CMOS sensor 812 performs A/D conversion on a signal (pixel signal) of each pixel by photoelectrically converting the incident light and performs signal processing such as CDS. Then, the CMOS sensor 812 supplies the processed output signal (imaged image data) to the image processing unit 815.

The operation unit 813 includes, for example, a jog dial (trademark), a key, a button, or a touch panel. The operation unit 813 receives an operation input by a user and supplies a signal corresponding to the operation input to the control unit 814.

The control unit 814 controls drive of the optical unit 811, the CMOS sensor 812, the image processing unit 815, the display unit 816, the codec processing unit 817, and the recording unit 818 on the basis of the signal corresponding to the operation input of the user input through the operation unit 813 and makes the units perform processing regarding imaging.

The image processing unit 815 performs processing on the output signal obtained by the CMOS sensor 812 (that is, image processing on imaged image data). More specifically, the image processing unit 815 performs various image processing relative to the imaged image data supplied from the CMOS sensor 812. For example, the image processing includes color mixture correction, black level correction, white balance adjustment, matrix processing, gamma correction, and YC conversion. The image processing unit 815 supplies the imaged image data on which the image processing is performed to the display unit 816 and the codec processing unit 817.

The display unit 816 is, for example, a liquid crystal display. The display unit 816 displays an image of the subject on the basis of the imaged image data supplied from the image processing unit 815.

The codec processing unit 817 performs predetermined system encoding processing on the imaged image data supplied from the image processing unit 815 and supplies the obtained encoded data to the recording unit 818.

The recording unit 818 records the encoded data from the codec processing unit 817. The encoded data recorded in the recording unit 818 is read and decoded by the image processing unit 815 as necessary. The imaged image data obtained by decoding processing is supplied to the display unit 816, and the imaged image corresponding to the imaged image data is displayed.

As the CMOS sensor 812 of the imaging device 800 as described above, the present technology is applied. That is, as the CMOS sensor 812, the imaging element according to the embodiments described above is used. With this application, the CMOS sensor 812 can prevent deterioration in image quality. Therefore, the imaging device 800 can obtain an image with high image quality by imaging the subject.

Note that, the configuration of the imaging device to which the present technology has been applied is not limited to those described above and may be any other configuration. For example, the imaging device may be an information processor having an imaging function such as not only a digital still camera, a video camera, but also a portable telephone, a smart phone, a tablet type device, and a personal computer. Furthermore, the imaging device may be a camera module which is used by being attached to the other information processor (or mounted as a built-in-device).

<Exemplary Usage of Image Sensor>

Figure 24:
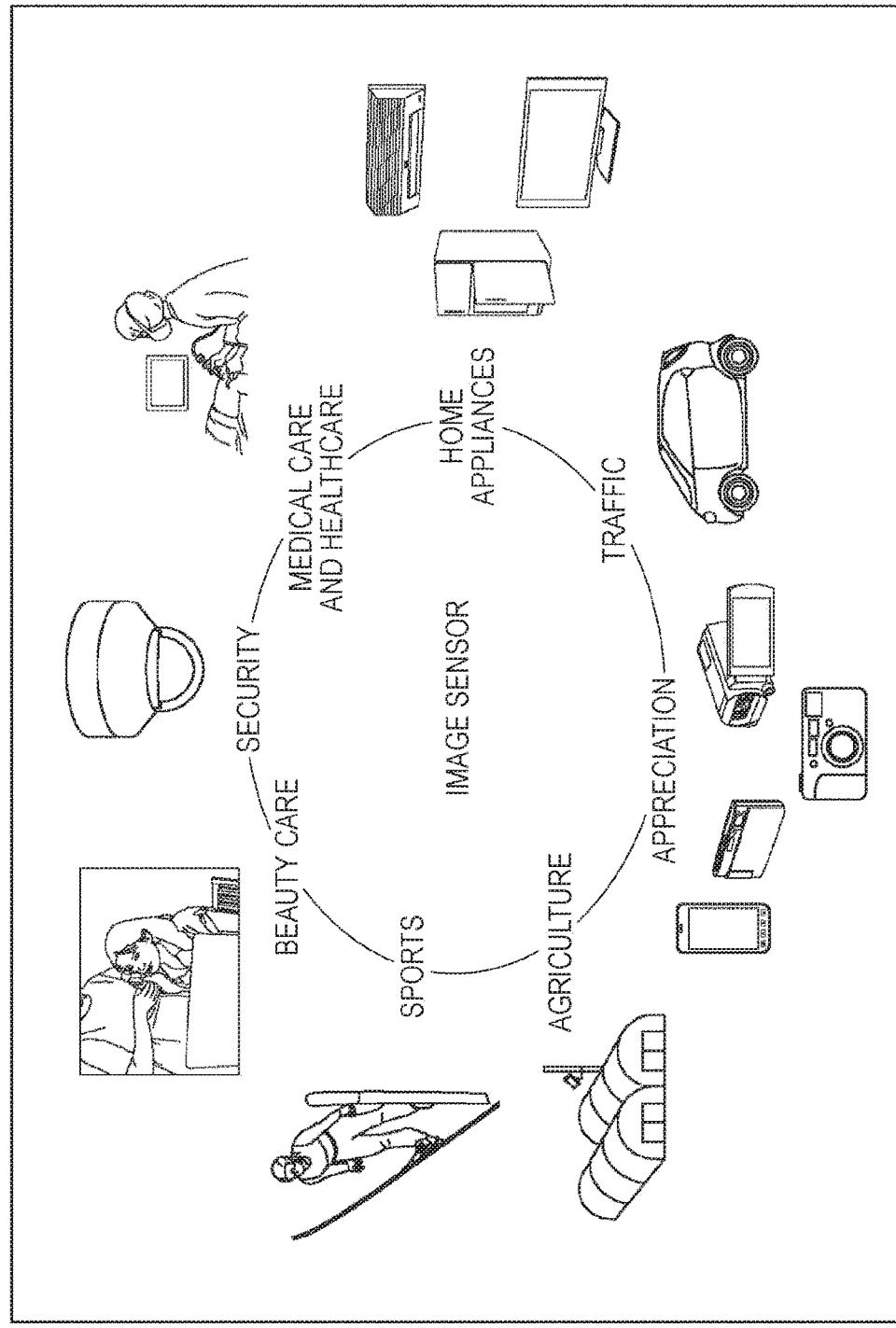
FIG. 24 is a diagram of exemplary usages of an image sensor.

FIG. 24 is a diagram of an exemplary usage of an image sensor (imaging elements 100 and 400) described above.

The image sensor described above can be used, for example, in various cases in which light such as visible light, infrared light, ultraviolet light, and X-rays are sensed as follows.
- A device which images an image to be used for appreciation, such as a digital camera and a portable device with a camera function
- A device which is used for traffic, such as an in-vehicle sensor for imaging the front, rear, surroundings, inside, and the like of a car for safe driving such as automatic stop, recognition of a driver's state, and the like, a monitoring camera for monitoring a traveling vehicle and a road, a distance measuring sensor for measuring a distance between vehicles, and the like
- A device which is used for home appliances, such as a TV, a refrigerator, an air conditioner, and the like to image a gesture of a user and operates the device according to the gesture
- A device which used for medical care and healthcare, such as an endoscope, a device for angiography by receiving infrared light, and the like
- A device which is used for security, such as a security monitoring camera, a camera for person authentication, and the like
- A device which is used for beauty care, such as a skin measuring instrument for photographing skin, a microscope for photographing a scalp, and the like
- A device which is used for sports, such as an action camera and a wearable camera for sports and the like
- A device which is used for agriculture, such as a camera for monitoring conditions of fields and crops Furthermore, the configuration described above as a single device (or processing unit) may be divided, and the divided parts may form a plurality of devices (or processing unit). Conversely, the configuration described above as a plurality of devices (or processing unit) may be collectively configured as a single device (or processing unit). Furthermore, a configuration other than the configuration described above may be added to the configuration of each device (or each processing unit). In addition, when the configuration and the operation as a whole system are substantially the same, a part of the configuration of a device (or processing unit) may be included in the configuration of the other device (or other processing unit).

Preferred embodiments of the present disclosure have been described in detail above with reference to the drawings. However, the technical scope of the present disclosure is not limited to the embodiments. It is obvious that a person who has normal knowledge in the technical field of the present disclosure can arrive at various variations and modifications in the scope of the technical ideas described in claims. It is understood that the variations and modifications naturally belong to the technical scope of the present disclosure.

Note that, the present technology can have the configuration below.

(1) An imaging element including:

a driving unit configured to drive a unit pixel to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal; and a correlated double sampling unit configured to generate a noise signal by correlated double sampling of the first signal and the second signal, to generate a data signal by correlated double sampling of the third signal and the fourth signal, and to generate an output signal by correlated double sampling of the data signal and the noise signal, in which before a reset signal to a gate electrode of the reset transistor is switched from a predetermined on voltage to a predetermined off voltage after the first signal is read, the driving unit sets the reset signal to an intermediate voltage between the on voltage and the off voltage.

(2) The imaging element according to (1), further including:

a control unit configured to control the intermediate voltage on the basis of the noise signal.

(3) The imaging element according to (1) or (2), in which the driving unit sets the intermediate voltage to a plurality of levels and approximates the reset signal from the on voltage to the off voltage in stages.

(4) The imaging element according to any one of (1) to (3), further including:

a control unit configured to control whether to provide a period in which the reset signal is set to the intermediate voltage, on the basis of a comparison result between the noise signal with the third signal or the data signal.

(5) The imaging element according to (1), in which the driving unit sets a first transition time when the reset signal to the gate electrode of the reset transistor is switched from the predetermined on voltage to the predetermined off voltage after the first signal is read to be longer than a second transition time when the reset signal is switched from the off voltage to the on voltage after the third signal is read.

(6) The imaging element according to (5), further including:

a control unit configured to control the first transition time on the basis of a comparison result between the noise signal with the third signal or the data signal.

(7) A driving method of an imaging element including:

driving a unit pixel to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal and setting a reset signal to an intermediate voltage between an on voltage and an off voltage before the reset signal to a gate electrode of the reset transistor is switched from the predetermined on voltage to the predetermined off voltage after the first signal is read; and generating a noise signal by correlated double sampling of the first signal and the second signal, generating a data signal by correlated double sampling of the third signal and the fourth signal, and generating an output signal by correlated double sampling of the data signal and the noise signal.

(8) An electronic device including:

an imaging element including:

a driving unit which drives a unit pixel to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal; and a correlated double sampling unit which generates a noise signal by correlated double sampling of the first signal and the second signal, generates a data signal by correlated double sampling of the third signal and the fourth signal, and generates an output signal by correlated double sampling of the data signal and the noise signal; and a signal processing unit configured to perform processing on the output signal, in which before a reset signal to a gate electrode of the reset transistor is switched from a predetermined on voltage to a predetermined off voltage after the first signal is read, the driving unit sets the reset signal to an intermediate voltage between the on voltage and the off voltage.

(9) An imaging element including:

a driving unit configured to drive a unit pixel to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal;

a correlated double sampling unit configured to generate a noise signal by correlated double sampling of the first signal and the second signal, to generate a data signal by correlated double sampling of the third signal and the fourth signal, and to generate an output signal by correlated double sampling of the data signal and the noise signal, in which a potential gradient of the channel unit of the reset transistor prevents movement of charges from the channel unit to the charge holding unit when the reset transistor is turned off.

(10) The imaging element according to (9), in which the potential gradient of the channel unit is formed depending on an impurity concentration of the channel unit.

(11) The imaging element according to (9), in which the potential gradient of the channel unit is formed depending on a change in a work function of a gate electrode of the reset transistor.

(12) A driving method of an imaging element including:

driving a unit pixel to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal and preventing movement of charges from the channel unit to the charge holding unit when the reset transistor is turned off by a potential gradient of the channel unit of the reset transistor; and generating a noise signal by correlated double sampling of the first signal and the second signal, generating a data signal by correlated double sampling of the third signal and the fourth signal, and generating an output signal by correlated double sampling of the data signal and the noise signal.

(13) An electronic device including:

an imaging element including:

a driving unit which drives a unit pixel to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal; and a correlated double sampling unit which generates a noise signal by correlated double sampling of the first signal and the second signal, generates a data signal by correlated double sampling of the third signal and the fourth signal, and generates an output signal by correlated double sampling of the data signal and the noise signal; and a signal processing unit configured to perform processing on the output signal, in which a potential gradient of the channel unit of the reset transistor prevents movement of charges from the channel unit to the charge holding unit when the reset transistor is turned off.

(14) An imaging element including:

a driving unit configured to drive a unit pixel to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal;

a correlated double sampling unit configured to generate a noise signal by correlated double sampling of the first signal and the second signal, to generate a data signal by correlated double sampling of the third signal and the fourth signal, and to generate an output signal by correlated double sampling of the data signal and the noise signal, in which variation in an amount of charges for moving from the channel unit of the reset transistor to the charge holding unit when the reset transistor is turned off after the first signal is read is reduced.

(15) A driving method of an imaging element including:
driving a unit pixel to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal and reducing variation in an amount of charges for moving from the channel unit of the reset transistor to the charge holding unit when the reset transistor is turned off after the first signal is read; and generating a noise signal by correlated double sampling of the first signal and the second signal, generating a data signal by correlated double sampling of the third signal and the fourth signal, and generating an output signal by correlated double sampling of the data signal and the noise signal.

(16) An electronic device including:
an imaging element including:
a driving unit which drives a unit pixel to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal; and a correlated double sampling unit which generates a noise signal by correlated double sampling of the first signal and the second signal, generates a data signal by correlated double sampling of the third signal and the fourth signal, and generates an output signal by correlated double sampling of the data signal and the noise signal; and a signal processing unit configured to perform processing on the output signal, in which
variation in an amount of charges for moving from the channel unit of the reset transistor to the charge holding unit when the reset transistor is turned off after the first signal is read is reduced.

REFERENCE SIGNS LIST

100 Imaging element
101 Pixel array unit
102 Vertical driving unit
103 A/D conversion unit
104 Horizontal driving unit
105 Calculation output unit
106 Control unit
111-1 to 111-M Reset line
112-1 to 112-M Row selection line
113-1 to 113-N Vertical signal line
121-1 to 121-N ADC
151 CDS processing unit
152 Storage unit
153 Data output unit
200 Unit pixel
201 Photoelectric conversion element
202 Charge holding unit
203, 203a, 203b Reset transistor
204 Amplification transistor
205 Selection transistor
211 to 213 Pixel power supply
301 DAC
302 Clamp controller
303 Adder
311-1 to 311-N Comparator
312-1 to 312-N Counter
400 Imaging element
401-1 to 401-M Reset signal correction unit
402 Control unit
501 Semiconductor substrate
503 Gate electrode
504 Drain diffusion layer
551, 551A, 551B Gate electrode
600 Unit pixel
601a, 601b Reset transistor
602 Capacitive element
700 Imaging element
701 Pixel chip
702 Circuit chip
711 Pixel array unit
712 Peripheral circuit region
800 Imaging device
812 CMOS sensor
815 Image processing unit

The invention claimed is:
1. An imaging element comprising:
a driving unit configured to drive a unit pixel to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal; and
a correlated double sampling unit configured to generate a noise signal by correlated double sampling of the first signal and the second signal, to generate a data signal by correlated double sampling of the third signal and the fourth signal, and to generate an output signal by correlated double sampling of the data signal and the noise signal, wherein
before a reset signal to a gate electrode of the reset transistor is switched from a predetermined on voltage to a predetermined off voltage after the first signal is read, the driving unit sets the reset signal to an intermediate voltage between the on voltage and the off voltage.

2. The imaging element according to claim 1, further comprising:
a control unit configured to control the intermediate voltage on the basis of the noise signal.

3. The imaging element according to claim 1, wherein the driving unit sets the intermediate voltage to a plurality of levels and approximates the reset signal from the on voltage to the off voltage in stages.

4. The imaging element according to claim 1, further comprising:
a control unit configured to control whether to provide a period in which the reset signal is set to the intermediate voltage, on the basis of a comparison result between the noise signal with the third signal or the data signal.

5. The imaging element according to claim 1, wherein the driving unit sets a first transition time when the reset signal to the gate electrode of the reset transistor is switched from the predetermined on voltage to the predetermined off voltage after the first signal is read to be longer than a second transition time when the reset signal is switched from the off voltage to the on voltage after the third signal is read.

6. The imaging element according to claim 5, further comprising:
a control unit configured to control the first transition time on the basis of a comparison result between the noise signal with the third signal or the data signal.

7. A driving method of an imaging element comprising:
driving a unit pixel to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal and setting a reset signal to an intermediate voltage between an on voltage and an off voltage before the reset signal to a gate electrode of the reset transistor is switched from the predetermined on voltage to the predetermined off voltage after the first signal is read; and
generating a noise signal by correlated double sampling of the first signal and the second signal, generating a data signal by correlated double sampling of the third signal and the fourth signal, and generating an output signal by correlated double sampling of the data signal and the noise signal.

8. An electronic device comprising:
an imaging element including:
a driving unit which drives a unit pixel to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal; and
a correlated double sampling unit which generates a noise signal by correlated double sampling of the first signal and the second signal, generates a data signal by correlated double sampling of the third signal and the fourth signal, and generates an output signal by correlated double sampling of the data signal and the noise signal; and
a signal processing unit configured to perform processing on the output signal, wherein
before a reset signal to a gate electrode of the reset transistor is switched from a predetermined on voltage to a predetermined off voltage after the first signal is read, the driving unit sets the reset signal to an intermediate voltage between the on voltage and the off voltage.

9. An imaging element comprising:
a driving unit configured to drive a unit pixel to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal; and
a correlated double sampling unit configured to generate a noise signal by correlated double sampling of the first signal and the second signal, to generate a data signal by correlated double sampling of the third signal and the fourth signal, and to generate an output signal by correlated double sampling of the data signal and the noise signal, wherein
a potential gradient of a channel unit of the reset transistor prevents movement of charges from the channel unit to the charge holding unit when the reset transistor is turned off.

10. The imaging element according to claim 9, wherein the potential gradient of the channel unit is formed depending on an impurity concentration of the channel unit.

11. The imaging element according to claim 9, wherein the potential gradient of the channel unit is formed depending on a change in a work function of a gate electrode of the reset transistor.

12. A driving method of an imaging element comprising:
driving a unit pixel to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal and preventing movement of charges from the channel unit to the charge holding unit when the reset transistor is turned off by a potential gradient of the channel unit of the reset transistor; and
generating a noise signal by correlated double sampling of the first signal and the second signal, generating a data signal by correlated double sampling of the third signal and the fourth signal, and generating an output signal by correlated double sampling of the data signal and the noise signal.

13. An electronic device comprising:
an imaging element including:
a driving unit which drives a unit pixel to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal; and
a correlated double sampling unit which generates a noise signal by correlated double sampling of the first signal and the second signal, generates a data signal by correlated double sampling of the third signal and the fourth signal, and generates an output signal by correlated double sampling of the data signal and the noise signal; and a signal processing unit configured to perform processing on the output signal, wherein a potential gradient of the channel unit of the reset transistor prevents movement of charges from the channel unit to the charge holding unit when the reset transistor is turned off.

14. An imaging element comprising:

a driving unit configured to drive a unit pixel to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal; and a correlated double sampling unit configured to generate a noise signal by correlated double sampling of the first signal and the second signal, to generate a data signal by correlated double sampling of the third signal and the fourth signal, and to generate an output signal by correlated double sampling of the data signal and the noise signal, wherein variation in an amount of charges for moving from the channel unit of the reset transistor to the charge holding unit when the reset transistor is turned off after the first signal is read is reduced.

15. A driving method of an imaging element, the driving method comprising:

driving a unit pixel to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal and reducing variation in an amount of charges for moving from the channel unit of the reset transistor to the charge holding unit when the reset transistor is turned off after the first signal is read; and generating a noise signal by correlated double sampling of the first signal and the second signal, generating a data signal by correlated double sampling of the third signal and the fourth signal, and generating an output signal by correlated double sampling of the data signal and the noise signal.

16. An electronic device comprising:

an imaging element including:

a driving unit which drives a unit pixel to read a first signal in a state where a reset transistor of the unit pixel is turned on and a charge holding unit is reset, to read a second signal in a state where the reset transistor is turned off after reading the first signal, to read a third signal in a state where the reset transistor is turned off and charges obtained by photoelectric conversion are accumulated in the charge holding unit, and to read a fourth signal in a state where the reset transistor is turned on and the charge holding unit is reset after reading the third signal; and a correlated double sampling unit which generates a noise signal by correlated double sampling of the first signal and the second signal, generates a data signal by correlated double sampling of the third signal and the fourth signal, and generates an output signal by correlated double sampling of the data signal and the noise signal; and a signal processing unit configured to perform processing on the output signal, wherein variation in an amount of charges for moving from the channel unit of the reset transistor to the charge holding unit when the reset transistor is turned off after the first signal is read is reduced.

* * * * *